(12) United States Patent
Han et al.

(10) Patent No.: US 11,901,203 B2
(45) Date of Patent: Feb. 13, 2024

(54) SUBSTRATE PROCESS ENDPOINT DETECTION USING MACHINE LEARNING

(71) Applicant: APPLIED MATERIALS, INC., Santa Clara, CA (US)

(72) Inventors: Pengyu Han, San Jose, CA (US); Lei Lian, Fremont, CA (US); Shu Yu Chen, Zhubei (TW); Todd Egan, Fremont, CA (US); Wan Hsueh Lai, New Taipei (TW); Chao-Hsien Lee, Taoyuan (TW); Pin Ham Lu, Taipei (TW); Zhengping Yao, Cupertino, CA (US); Barry Craver, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 157 days.

(21) Appl. No.: 17/344,787

(22) Filed: Jun. 10, 2021

(65) Prior Publication Data

US 2022/0399215 A1    Dec. 15, 2022

(51) Int. Cl.
*H01L 21/67* (2006.01)
*G01N 21/95* (2006.01)
(Continued)

(52) U.S. Cl.
CPC ... *H01L 21/67253* (2013.01); *G01N 21/9501* (2013.01); *G06N 20/00* (2019.01); *G05B 13/0265* (2013.01)

(58) Field of Classification Search
CPC ......... H01L 21/67253; H01L 21/67069; H01L 21/67167; H01L 21/67213;
(Continued)

(56) References Cited

U.S. PATENT DOCUMENTS

| 7,399,711 B2 | 7/2008 | Perry et al. |
| 8,115,912 B2 | 2/2012 | Kimba |

(Continued)

FOREIGN PATENT DOCUMENTS

| JP | 2010-237194 A1 | 10/2010 |
| JP | 2000182420 A | 6/2020 |

(Continued)

OTHER PUBLICATIONS

PCT International Search Report and Written Opinion for International Application No. PCT/US2022/032879 dated Sep. 27, 2022, 9 pages.

(Continued)

*Primary Examiner* — Robert G Bachner
(74) *Attorney, Agent, or Firm* — LOWENSTEIN SANDLER LLP

(57) ABSTRACT

Methods and systems for detection of an endpoint of a substrate process are provided. A set of machine learning models are trained to provide a metrology measurement value associated with a particular type of metrology measurement for a substrate based on spectral data collected for the substrate. A respective machine learning model is selected to be applied to future spectral data collected during a future substrate process for a future substrate in view of a performance rating associated with the particular type of metrology measurement. Current spectral data is collected during a current process for a current substrate and provided as input to the respective machine learning model. An indication of a respective metrology measurement value corresponding to the current substrate is extracted from one or more outputs of the trained machine learning model. In response to a determination that the respective metrology measurement satisfies a metrology measurement criterion, (Continued)

an instruction including a command to terminate the current process is generated.

20 Claims, 12 Drawing Sheets

(51) Int. Cl.
*G06N 20/00* (2019.01)
*G05B 13/02* (2006.01)

(58) Field of Classification Search
CPC .......... H01L 21/67225; G01N 21/9501; G06N 20/00; G06N 3/045; G06N 3/084; G06N 5/01; G06N 20/10; G06N 20/20; G05B 13/0265; G05B 2219/32368; G05B 2219/45031; G05B 19/41885
See application file for complete search history.

(56) References Cited

U.S. PATENT DOCUMENTS

| | | | |
|---|---|---|---|
| 8,554,356 B2 | 10/2013 | Shimizu et al. | |
| 9,176,276 B2 | 11/2015 | Suijver et al. | |
| 11,421,977 B2 | 8/2022 | Lian et al. | |
| 11,501,986 B2 | 11/2022 | Cheung et al. | |
| 2002/0173084 A1 | 11/2002 | Ohkawa | |
| 2004/0073120 A1 | 4/2004 | Motz et al. | |
| 2008/0099436 A1 | 5/2008 | Grimbergen | |
| 2012/0009849 A1 | 1/2012 | Kimba | |
| 2013/0281672 A1 | 10/2013 | Belousov et al. | |
| 2015/0039118 A1 | 2/2015 | Samantaray et al. | |
| 2015/0377701 A1 | 12/2015 | Pawluczyk et al. | |
| 2016/0097713 A1 | 4/2016 | Kester et al. | |
| 2018/0173118 A1 | 6/2018 | Schmitt-Weaver et al. | |
| 2019/0244870 A1 | 8/2019 | Feng et al. | |
| 2019/0286111 A1 | 9/2019 | Yennie et al. | |
| 2019/0348312 A1 | 11/2019 | Kommisetti et al. | |
| 2020/0026196 A1 | 1/2020 | Luo et al. | |
| 2020/0193290 A1 | 6/2020 | Cho et al. | |
| 2020/0372629 A1 | 11/2020 | Chen et al. | |
| 2021/0407839 A1 | 12/2021 | Tsujihashi | |
| 2022/0065618 A1 | 3/2022 | Kim et al. | |
| 2022/0270237 A1 | 8/2022 | Sawlani et al. | |

FOREIGN PATENT DOCUMENTS

| | | |
|---|---|---|
| WO | 2021030833 A1 | 2/2021 |
| WO | 2021061541 A1 | 4/2021 |
| WO | 2021004725 A1 | 11/2021 |
| WO | 2022234831 A1 | 11/2022 |

OTHER PUBLICATIONS

PCT International Search Report and Written Opinion for International Application No. PCTUS2022032882 dated Sep. 27, 2022, 10 pages.

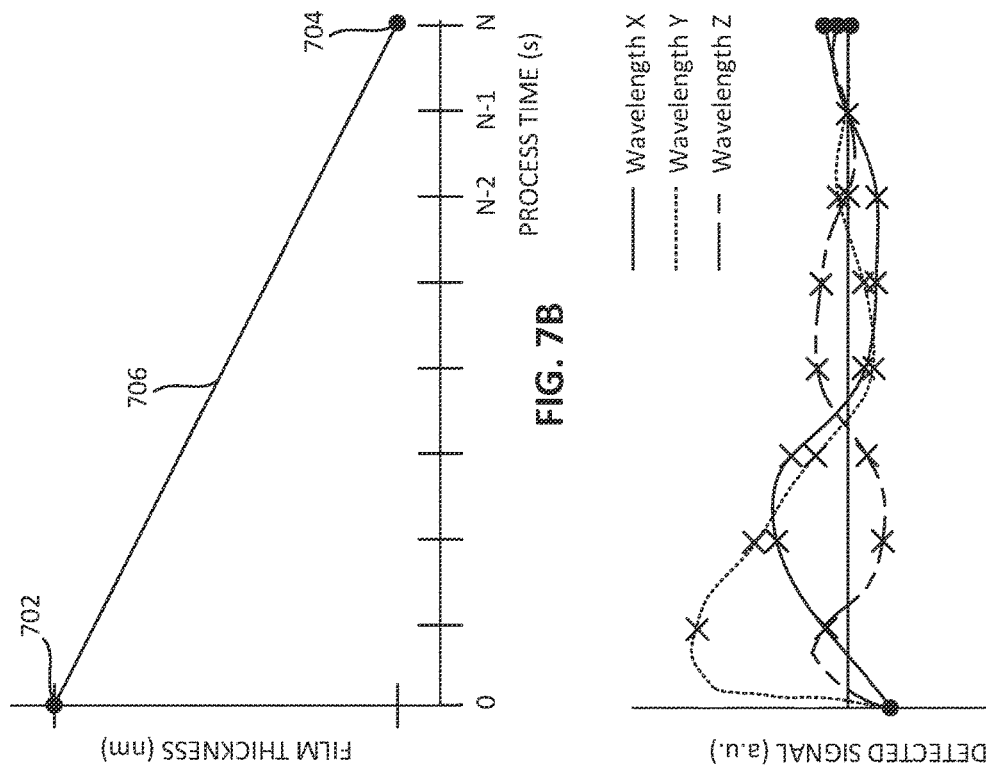
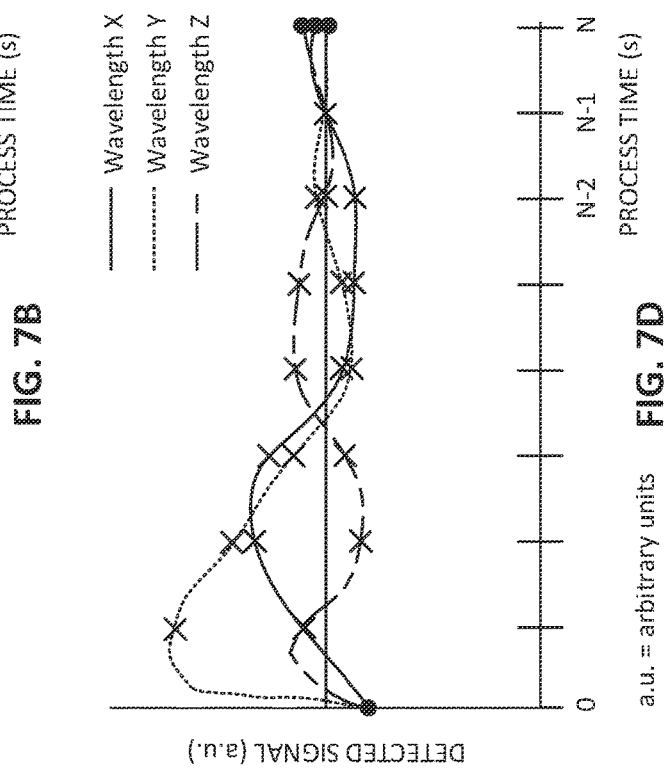
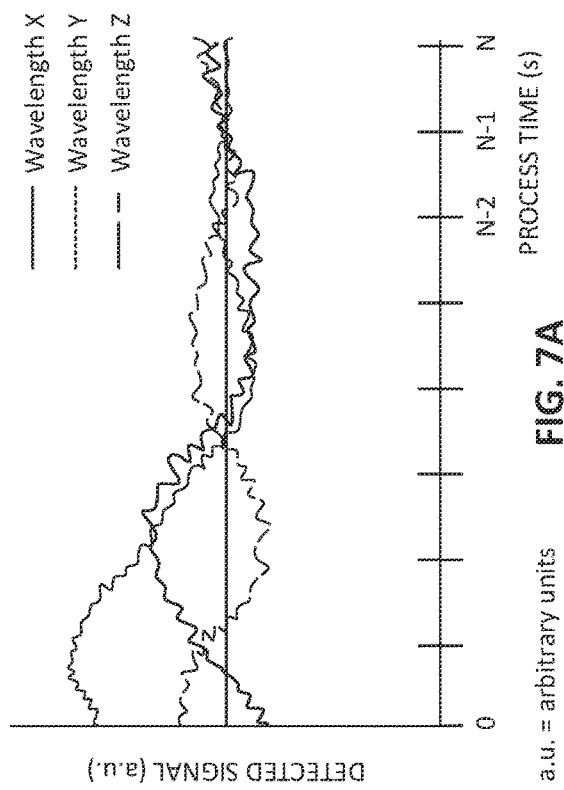
FIG. 7A
FIG. 7B
FIG. 7C
FIG. 7D

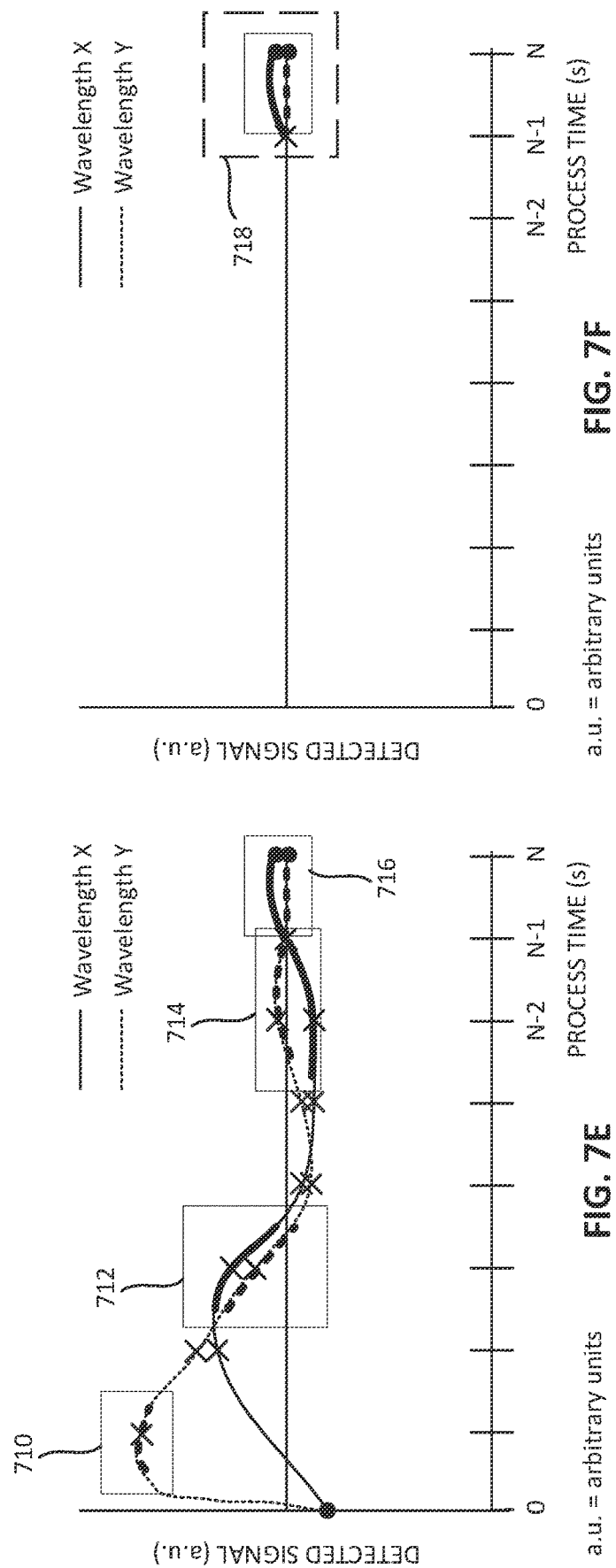

SUBSTRATE PROCESS ENDPOINT DETECTION USING MACHINE LEARNING

TECHNICAL FIELD

Embodiments of the present disclosure relate, in general, to manufacturing systems and more particularly to substrate process endpoint detection using machine learning.

BACKGROUND

Manufacturing microelectronics and integrated circuit devices often involves performing numerous operations on semiconductor, dielectric, and conductive substrates. In some instances, monocrystals, semiconductor films, find coatings, and numerous other substances are used in electronic device manufacturing and other practical applications. As atoms of selected types are added (e.g., via deposition) to substrates or removed (e.g., via etching) from the substrates, efficient and precise endpoint monitoring techniques and systems become valuable. Under-processing (e.g., under-deposition, under-etching) as well as over-processing (e.g., over-deposition, over-processing) can result in substandard and malfunctioning devices. Accordingly, optical control systems that allow real-time monitoring of various stages of device manufacturing can significantly improve the quality of products and are especially useful given the constant increasing demands of quality semiconductor devices.

SUMMARY

Some of the embodiments described cover a method for training a machine learning model to provide metrology measurements for a current substrate being processed according to a current process at a first manufacturing system. The method includes obtaining a set of historical spectral data associated with a prior substrate processed at a second manufacturing system according to a prior process. The set of historical spectral data includes historical spectral data collected for the prior substrate during each of a set of steps of the prior process. The method further includes generating a normalized set of historical spectral data based on the set of historical spectral data. The normalized set of historical spectral data is generated based on a difference between first historical spectral data collected during an initial step of the set of steps of the prior process and second historical spectral data collected during one or more subsequent steps of the set of steps. The method further includes generating training data for the machine learning model. Generating the training data includes generating a training input including a subset of historical spectral data extracted from the normalized set of historical spectral data. The subset of historical spectral data includes an indication of one or more historical spectral features associated with a particular type of metrology measurement. Generating the training data further includes generating a target output for the training input. The target output includes a historical metrology measurement value for the prior substrate, the historical metrology measurement value associated with the particular type of metrology measurement. The method further includes providing the training data to train the machine learning model on (i) a set of training inputs comprising the training input and (ii) a set of target outputs comprising the target output.

In some embodiments, a system includes a memory to store a trained machine learning model and a processing device coupled to the memory. The processing device is to receive a set of spectral data associated with a current substrate being processed at a manufacturing system according to a current process. The received set of spectral data is associated with a current step of the current process performed for the current substrate. The processing device is further to generate a normalized set of spectral data based on the received set of spectral data. The normalized set of spectral data is generated based on a difference between spectral data collected during the current step of the current process and spectral data collected during a prior step of the current process. The processing device is further to provide, as input to the trained machine learning model, a subset of spectral data extracted from the normalized set of spectral data. The subset of spectral data includes an indication of one or more spectral features corresponding to a particular type of metrology measurement. The processing device is further to obtain one or more outputs of the trained machine learning model. The processing device is further to extract, from the one or more outputs, metrology measurement data identifying one or more metrology measurement values associated with the particular type of metrology measurement, the one or more metrology measurement values obtained for a prior substrate processed at the manufacturing system according to a prior process, and an indication of a level of confidence that each of the one or more metrology measurement values corresponds to the current substrate.

In some embodiments, a non-transitory computer readable storage medium includes instructions that, when executed by a processing device, cause the processing device to receive a set of spectral data associated with a current substrate being processed at a manufacturing system according to a current process. The received set of spectral data is associated with a current step of the current process performed for the current substrate. The processing device is further to generate a normalized set of spectral data based on the received set of spectral data. The normalized set of spectral data is generated based on a difference between spectral data collected during the current step of the current process and spectral data collected during a prior step of the current process. The processing device is further to provide, as input to the trained machine learning model, a subset of spectral data extracted from the normalized set of spectral data. The subset of spectral data includes an indication of one or more spectral features corresponding to a particular type of metrology measurement. The processing device is further to obtain one or more outputs of the trained machine learning model. The processing device is further to extract, from the one or more outputs, metrology measurement data identifying one or more metrology measurement values associated with the particular type of metrology measurement, the one or more metrology measurement values obtained for a prior substrate processed at the manufacturing system according to a prior process, and an indication of a level of confidence that each of the one or more metrology measurement values corresponds to the current substrate.

In some embodiments, a method is provided including providing training data to train each of a set of machine learning models to provide a metrology measurement value associated with a particular type of metrology measurement for a substrate based on spectral data collected during a substrate process performed for the substrate. Each of the set of machine learning models are associated with a different type of a set of machine learning model types. The method further includes assigning a performance rating to each of the set of machine learning models based on an accuracy of a provided value for the metrology measurement provided by a respective machine learning model in view of a measured value for the metrology measurement, the measured value generated based on historical metrology data collected by metrology equipment for a prior substrate of a set of prior substrates. The method further includes selecting, in view of the performance rating for each of the set of machine learning models, the respective machine learning model to be applied to future spectral data collected during a future substrate process performed for a future substrate.

In some embodiments, a system includes a memory and a processing device coupled to the memory. The processing device is to obtain a machine learning model trained to provide a current value for a metrology measurement based on current spectral data collected during a current process for a current substrate at a manufacturing system. The trained machine learning model is associated with a performance rating that satisfies a performance criterion associated with a type of the metrology measurement. The processing device is further to provide the current spectral data as input to the trained machine learning model. The processing device is further to extract, from one or more outputs of the trained machine learning model, an indication of a respective metrology measurement value corresponding to the current substrate. The respective metrology measurement value is associated with the type of the metrology measurement. The processing device is further to, responsive to determining that the respective metrology measurement value satisfies a metrology measurement criterion associated with the current process, generating an instruction including a command to terminate the current process at the manufacturing system.

In some embodiments, a non-transitory computer readable storage medium includes instructions that, when executed by a processing device, cause the processing device to provide training data to train each of a set of machine learning models to provide a metrology measurement value associated with a particular type of metrology measurement for a substrate based on spectral data collected during a substrate process performed for the substrate. Each of the set of machine learning models are associated with a different type of a set of machine learning model types. The processing device is further to assign a performance rating to each of the set of machine learning models based on an accuracy of a provided value for the metrology measurement provided by a respective machine learning model in view of a measured value for the metrology measurement. The measured value generated based on historical metrology data collected by metrology equipment for a prior substrate of a set of prior substrates. The processing device is further to select, in view of the performance rating for each of the set of machine learning models, the respective machine learning model to be applied to future spectral data collected during a future substrate process performed for a future substrate.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIGS. 7A-7F illustrates obtaining data for use with a machine learning model, according to aspects of the present disclosure.

DETAILED DESCRIPTION OF EMBODIMENTS

Figure 1:
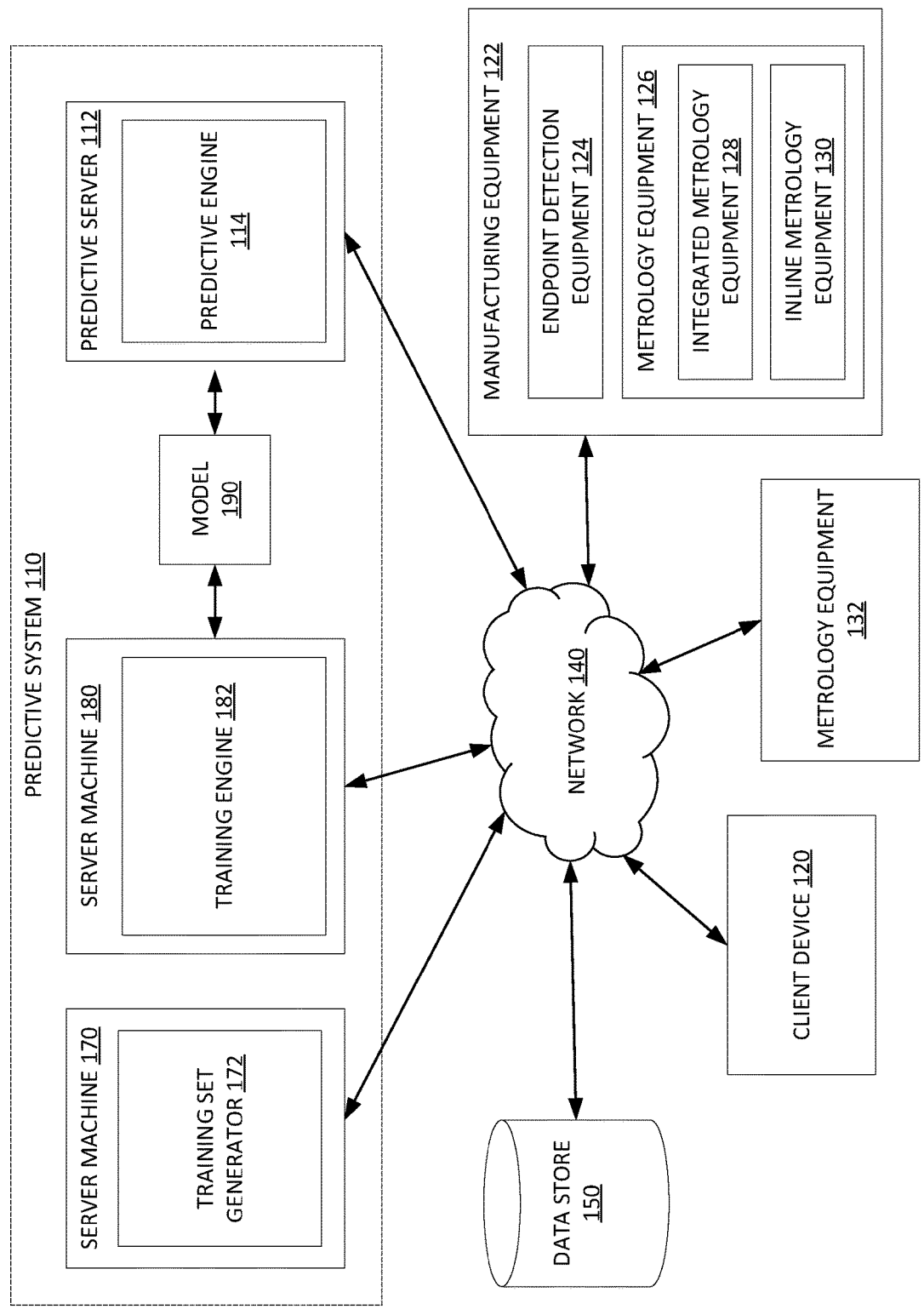
FIG. 1 depicts an illustrative computer system architecture, according to aspects of the present disclosure.

Embodiments of the present disclosure are directed to an endpoint detection system for enhanced spectral data collection. A substrate process (e.g., a deposition process, an etch process, etc.) can be performed for a substrate at a process chamber of a manufacturing system. An endpoint of a substrate process refers to a point of the process at which a profile of the substrate corresponds to (i.e., matches or substantially matches) a target substrate profile. For example, a mask including a pattern for a target substrate profile can be used during an etching process for a substrate, such as a silicon wafer. The mask can be placed on a surface of the wafer and exposed to a reactive (e.g., wet or dry etching) environment to remove portions of the substrate that are not protected by the mask. An endpoint of the etch process refers to a point of the etch process at which the profile of the substrate corresponds to the pattern for the target substrate profile provided by the mask.

Deviations from a process procedure can result in variations on the speed and/or uniformity of a substrate process. For example, changes in an etching environment or differences in photomask patterns can result in variations in the speed and uniformity of etching, both across the surface of a substrate and between etch processes for multiple substrates. Tracking and responding to such changes involves precise and adjustable optical endpoint systems capable of collecting accurate and substantial optical response data that characterizes the surface of a substrate at various time periods during the substrate process. The goal of accuracy is further driven by shrinking dimensions of microelectronic devices, increasingly complex designs of photomasks, and raising demands for device uniformity. Existing endpoint detection systems are often incapable of meeting such increased technological demands.

Aspects and implementations of the present disclosure address this and other shortcomings of conventional technologies by methods and systems for substrate process endpoint detection using machine learning. Endpoint detection equipment can be coupled to or disposed with a process chamber and can be configured to collect spectral data for a substrate during a substrate process. Spectral data refers to data associated with an intensity (i.e., a strength or amount of energy) for a detected wave of energy for each wavelength of light reflected from a surface of the substrate. The endpoint detection equipment can transmit the collected spectral data to a processing device of the manufacturing system including the process chamber (e.g., a system controller for the manufacturing system. The processing device can generate normalized spectral data based on the spectral data collected by the endpoint detection equipment and can extract subsets of spectral data from the normalized spectral data that include spectral features associated with a particular type of metrology measurement (e.g., critical dimension, etc.).

The processing device can provide the subsets of spectral data as input to a machine learning model that is trained to provide a metrology measurement value associated with the particular type of metrology measurement for the substrate at the time period at which the spectral data is collected. The machine learning model can be selected to be applied to the spectral data for the substrate from a set of trained machine learning models that are each associated with a different machine learning model type. The machine learning model can be selected as the trained machine learning model that has a performance rating that satisfies a performance criterion with respect to the particular type of metrology measurement. In some embodiments, the machine learning model is trained and selected for use by the system controller. In other or similar embodiments, the machine learning model is trained and/or selected for use by another processing device that is separate from the system controller for the manufacturing system (e.g., at an offline server that is inaccessible to a user of the manufacturing system).

The processing device can obtain one or more outputs of the trained machine learning model and extract a provided metrology measurement value for the substrate from the one or more outputs. The processing device can determine whether the provided metrology measurement value satisfies a measurement criterion (i.e., approximately corresponds to a target metrology measurement value for the substrate process). If the provided metrology measurement value satisfies the measurement criterion, this can indicate that an endpoint for the substrate process is reached (i.e., the current profile for the substrate corresponds to a target substrate profile). In response to determining that the measurement criterion is satisfied, the processing device can terminate the substrate process at the process chamber. For example, the processing device can generate an instruction that causes the substrate process to end. In response to determining that the measurement criterion is not satisfied, the processing device can allow the substrate process to continue at the process chamber (e.g., the processing device can generate no instruction for the process chamber).

Aspects of the present disclosure address deficiencies of the conventional technology by providing systems and methods for training and using a machine learning model to detect an endpoint of a substrate process. Endpoint detection equipment coupled to the process chamber can collect spectral data for a substrate at a particular frequency during a substrate process. The collected spectral data can be provided as input to the trained machine learning model, which provides real-time estimations for particular types of metrology measurement values for the substrate, which are used to determine whether the endpoint of the substrate process is reached. The frequency collection of spectral data and estimation of metrology measurement values allows for frequency endpoint monitoring at the process chamber, which prevents the likelihood of under-processing (e.g., under-etching, under-deposition, etc.) or over-processing (e.g., over-etching, over-deposition, etc.) of the substrate. As a result, a number of defects that occur within the manufacturing system will decrease, thereby improving overall system efficiency and overall system yield.

The particular type of metrology measurement value for the substrate can be selected (e.g., by an operator, an engineer, etc.) as an endpoint metric that indicates the endpoint of the substrate process at a higher accuracy than other endpoint metrics associated with other types of metrology measurement values. As the machine learning model is trained and selected from a set of different types of machine learning models as a model with a performance rating that satisfies a performance criterion associated with the particular type of metrology measurement value, the provided metrology measurement value for the substrate is associated with a higher degree of accuracy than other metrology measurement values provided by conventional metrology estimation systems. Accordingly, the metrology measurement value provided by the selected machine learning model is associated with a high accuracy rating, which improves the accuracy of the endpoint detection based on the provided metrology measurement value, further preventing the likelihood of under-processing or over-processing of the substrate.

In addition, as described above, the machine learning model can be trained and selected from the set of machine learning models at a processing device that is separate from the system controller for the manufacturing system. This significantly reduces the amount of system resources that are consumed by the system controller and increases overall system efficiency and reduces overall system latency.

The endpoint detection system of the present disclosure provides enhanced spectral data collection that is not possible with conventional endpoint detection systems. The optical bundle of the endpoint detection system of the present disclosure enables the transmission of multiple incident light signals from the light source component to the substrate surface as well as the transmission of multiple reflected light signals from the substrate surface to the light detector without the use of additional equipment (e.g., a beam splitter) that can reduce the power of the transmitted signal. As such, the optical bundle collects reflected light more efficiently, reduces signal loss of the reflected light beam, and ensures that the reflected light signal has an overall larger magnitude than a conventional fiber optic cable. The collimator assembly of the endpoint detection system generates beams of incident light that have a uniform spatial profile for a broad range of wavelengths. For example, the width of an incident light beam can be the same for a 250 nm spectral component of the beam as well as for a 750 nm spectral component of the beam. In addition, the width of the incident light beam can be the same even if beam alignment varies between different manufacturing systems. The enhanced uniformity ensures a more accurate measurement of the optical response of a target portion of a substrate surface inside the process chamber, and therefore offers more accurate data that allows for a more precise determination of the state of a substrate profile during the substrate process.

FIG. 1 depicts an illustrative computer system architecture 100, according to aspects of the present disclosure. Computer system architecture 100 includes a client device 120, manufacturing equipment 122, metrology equipment 132, a predictive server 112 (e.g., to generate predictive data, to provide model adaptation, to use a knowledge base, etc.), and a data store 150. The predictive server 112 can be part of a predictive system 110. The predictive system 110 can further include server machines 170 and 180. In some embodiments, computer system architecture 100 can include or be a part of a manufacturing system for processing substrates, such as manufacturing system 200 of FIG. 2. In additional or alternative embodiments, computer system architecture 100 can include or be a part of an endpoint detection system for detecting an endpoint of a substrate process. Further details regarding the endpoint detection system are provided with respect to FIG. 3.

Components of the client device 120, manufacturing equipment 122, metrology equipment 132, predictive system 110, and/or data store 150 can be coupled to each other via a network 140.

In some embodiments, network 140 is a public network that provides client device 120 with access to predictive server 112, data store 150, and other publicly available computing devices. In some embodiments, network 140 is a private network that provides client device 120 access to manufacturing equipment 122, metrology equipment 132, data store 150, and other privately available computing devices. Network 140 can include one or more wide area networks (WANs), local area networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

The client device 120 can include a computing device such as personal computers (PCs), laptops, mobile phones, smart phones, tablet computers, netbook computers, network connected televisions ("smart TVs"), network-connected media players (e.g., Blu-ray player), a set-top box, over-the-top (OTT) streaming devices, operator boxes, etc.

Manufacturing equipment 122 can produce products following a recipe or performing runs over a period of time. In some embodiments, manufacturing equipment 122 can include or be a part of a process tool that includes one or more stations (e.g., process chamber, transfer chamber, load lock, etc.) configured to perform a different function for a substrate. In some embodiments, manufacturing equipment 122 can further include endpoint detection equipment 124 that is configured to collect data to be used for detecting an endpoint of a process performed for a substrate at manufacturing equipment 122. An endpoint of a substrate process refers to a point of the process at which a profile of the substrate corresponds to (i.e., matches or substantially matches) a target profile. Endpoint detection equipment 124 can include one or more components configured to collect and/or generate spectral data associated with one or more portions of a profile of a surface of the substrate during a substrate process. Spectral data refers to data associated with an intensity (i.e., a strength or amount of energy) for a detected wave of energy for each wavelength of the detected wave.

In some embodiments, endpoint detection equipment 124 can include an optical fiber bundle and a collimator assembly that are configured to direct incident light from a light source to a surface of a substrate and transmit reflected light from the substrate surface to a light detection component. A processing device (e.g., a system controller for the process tool) coupled to endpoint detection equipment 124 can generate the spectral data for the substrate profile based on the reflected light transmitted to the light detection component. In other or similar embodiments, endpoint detection equipment 124 can include any sensors configured to generate spectral data associated with the substrate profile. Such sensors can include reflectometry sensors, ellipsometry sensors, thermal spectra sensors, capacitive sensors, and so forth. Further details regarding manufacturing equipment 122 and endpoint detection equipment 124 are described with regard to FIGS. 2 and 5, respectively.

In some embodiments, one or more stations of manufacturing equipment 122 can include sensors configured to generate and/or collect sensor data associated with manufacturing equipment 122. Sensor data can include a value of one or more of temperature (e.g., heater temperature), spacing (SP), pressure, high frequency radio frequency (HFRF), voltage of electrostatic chuck (ESC), electrical current, flow, power, voltage, etc. Sensor data can be associated with or indicative of manufacturing parameters such as hardware parameters, such as settings or components (e.g., size, type, etc.) of the manufacturing equipment 122, or process parameters of the manufacturing equipment 122. The sensor data can be provided while the manufacturing equipment 122 is performing a substrate process. The sensor data can be different for each substrate.

In some embodiments, manufacturing equipment 122 can include metrology equipment 126. Metrology equipment 126 can be configured to generate metrology data associated with substrates processed by manufacturing equipment 122. The metrology data can include a value of one or more of film property data (e.g., wafer spatial film properties), dimensions (e.g., thickness, height, etc.), dielectric constant, dopant concentration, density, defects, etc. In some embodiments, the metrology data can further include a value of one or more surface profile property data (e.g., an etch rate, an etch rate uniformity, a critical dimension of one or more features included on a surface of the substrate, a critical dimension uniformity across the surface of the substrate, an edge placement error, etc.). The metrology data can be of a finished or semi-finished product. The metrology data can be different for each substrate.

Metrology equipment 126 can be configured to generate metrology data associated with a substrate before or after a substrate process. Metrology equipment 126 can be integrated with a station of the process tool of manufacturing equipment 122. In some embodiments, metrology equipment 126 can be coupled to or be a part of a station of the process tool that is maintained under a vacuum environment (e.g., a process chamber, a transfer chamber, etc.). Such metrology equipment 126 is referred to as integrated metrology equipment 128. Accordingly, the substrate can be measured by the integrated metrology equipment 128 while the substrate is in the vacuum environment. For example, after a substrate process (e.g., an etch process, a deposition process, etc.) is performed for the substrate, the metrology data for the processed substrate can be generated by integrated metrology equipment 128 without the processed substrate being removed from the vacuum environment. In other or similar embodiments, metrology equipment 126 can be coupled to or be a part of the process tool station that is not maintained under a vacuum environment (e.g., a factory interface module, etc.). Such metrology equipment 126 is referred to as inline metrology equipment 130. Accordingly, the substrate is measured by inline metrology equipment 130 outside of the vacuum environment.

Additionally or alternatively to metrology equipment 126, computer system architecture 100 can include metrology equipment 132. Metrology equipment 132 can include metrology measurement devices that are separate (i.e., external) from manufacturing equipment 122. For example, metrology equipment 132 can be standalone equipment that is not coupled to any station of manufacturing equipment 122. For a measurement to be obtained for a substrate using metrology equipment 132, a user of a manufacturing system (e.g., an engineer, an operator) can cause a substrate processed at manufacturing equipment 124 to be removed from manufacturing equipment 122 and transferred to metrology equipment 132 for measurement. In some embodiments, metrology equipment 132 can transfer metrology data generated for the substrate to the client device 120 coupled to metrology equipment 132 via network 140 (e.g., for presentation to a manufacturing user, such as an operator or an engineer). In other or similar embodiments, the manufacturing system user can obtain metrology data for the substrate from metrology equipment 132 and can provide the metrology data to computer system architecture via a graphical user interface (GUI) of client device 120.

Data store 150 can be a memory (e.g., random access memory), a drive (e.g., a hard drive, a flash drive), a database system, or another type of component or device capable of storing data. Data store 150 can include multiple storage components (e.g., multiple drives or multiple databases) that can span multiple computing devices (e.g., multiple server computers). The data store 150 can store spectral data, non-spectral data (e.g., sensor data), metrology data, predictive data, and so forth. Spectral data can include historical spectral data (e.g., spectral data generated for a previous substrate processed at manufacturing equipment 122 or at other manufacturing equipment coupled to data store 150 via network 140) and/or current spectra data (spectral data generated for a current substrate being processed at manufacturing equipment 122). Current spectral data can be data for which predictive data is generated. In some embodiments, metrology data can include historical metrology data (e.g., metrology measurement values for a prior substrate processed at the manufacturing equipment 122 or at other manufacturing equipment). The data store 150 can also store contextual data associated with a substrate being processed at the manufacturing system (e.g., recipe name, recipe step number, preventive maintenance indicator, operator, etc.).

One or more portions of data store 150 can be configured to store data that is not accessible to a user of the manufacturing system. In some embodiments, all data stored at data store 150 can be inaccessible by the manufacturing system user. In other or similar embodiments, a portion of data stored at data store 150 is inaccessible by the user while another portion of data stored at data store 150 is accessible to the user. In some embodiments, inaccessible data stored at data store 150 is encrypted using an encryption mechanism that is unknown to the user (e.g., data is encrypted using a private encryption key). In other or similar embodiments, data store 150 can include multiple data stores where data that is inaccessible to the user is stored in a first data store and data that is accessible to the user is stored in a second data store.

In some embodiments, predictive system 110 includes server machine 170 and server machine 180. Server machine 170 includes a training set generator 172 that is capable of generating training data sets (e.g., a set of data inputs and a set of target outputs) to train, validate, and/or test a machine learning model 190 or set of machine learning models 190. Some operations of training set generator 172 are described in detail below with respect to FIG. 4. In some embodiments, the training set generator 172 can partition the training data into a training set, a validating set, and a testing set.

Server machine 180 can include a training engine 182. An engine can refer to hardware (e.g., circuitry, dedicated logic, programmable logic, microcode, processing device, etc.), software (such as instructions run on a processing device, a general purpose computer system, or a dedicated machine), firmware, microcode, or a combination thereof. Training engine 182 can be capable of training a machine learning model 190 or a set of machine learning models 190. The machine learning model 190 can refer to the model artifact that is created by the training engine 182 using the training data that includes training inputs and corresponding target outputs (correct answers for respective training inputs). The training engine 182 can find patterns in the training data that map the training input to the target output (the answer to be predicted), and provide the machine learning model 190 that captures these patterns. The machine learning model 190 can include a linear regression model, a partial least squares regression model, a Gaussian regression model, a random forest model, a support vector machine model, a neural network, a ridge regression model, and so forth.

Training engine 182 can also be capable of validating a trained machine learning model 190 using a corresponding set of features of a validation set from training set generator 172. In some embodiments, training engine 182 can assign a performance rating for each of a set of trained machine learning models 190. A performance rating can correspond to an accuracy of a respective trained model, a speed of the respective model, and/or an efficiency of the respective model. Training engine 182 can select a trained machine learning model 190 having a performance rating that satisfies a performance criterion to be used by predictive component 114, in accordance with embodiments described herein. Further details regarding training engine 182 are provided with respect to FIG. 9.

Predictive server 112 includes a predictive engine 114 that is capable of providing spectral data for a portion of a current substrate being processed at manufacturing equipment 122 as input to trained machine learning model 190 and running trained model 190 on the input to obtain one or more outputs. In some embodiments, trained model 190 run by predictive engine 114 is selected by training engine 182 as having a performance rating that satisfies a performance criterion, as described above. As described further with respect to FIG. 8, in some embodiments, predictive engine 114 is also capable of extracting data from the output of the trained machine learning model 190 and using the confidence data to provide a metrology measurement for the portion of the substrate.

Confidence data can include or indicate a level of confidence that a metrology value corresponds one or more properties of a substrate associated with current spectral data. In one example, the level of confidence is a real number between 0 and 1, where 0 indicates no confidence that the metrology value corresponds to one or more properties of the substrate associated with the current spectral data and 1 indicates absolute confidence that the metrology value corresponds to one or more properties of the substrate associated with the current spectral data. In some embodiments, an endpoint detection system can use predictive system 110 to provide metrology values for a substrate being processed at the manufacturing system instead of using the inline metrology equipment 128, integrated metrology equipment 130, and/or external metrology equipment 132 to determine measured metrology values. The endpoint detection system can determine whether the endpoint of the substrate process is reached based on the provided metrology values for the substrate, in accordance with embodiments provided herein.

It should be noted that in some other implementations, the functions of server machines 170 and 180, as well as predictive server 112, can be provided by a larger or smaller number of machines. For example, in some embodiments, server machines 170 and 180 can be integrated into a single machine, while in some other or similar embodiments, server machines 170 and 180, as well as predictive server 112, can be integrated into a single machine. In general, functions described in one implementation as being performed by server machine 170, server machine 180, and/or predictive server 112 can also be performed on client device 120. In addition, the functionality attributed to a particular component can be performed by different or multiple components operating together. Further details regarding the grouping of functions of server machines 170, 180, as well as predictive server 112 are provided with respect to FIG. 3.

In embodiments, a "user" can be represented as a single individual. However, other embodiments of the disclosure encompass a "user" being an entity controlled by a plurality of users and/or an automated source. For example, a set of individual users federated as a group of administrators can be considered a "user."

Figure 2:
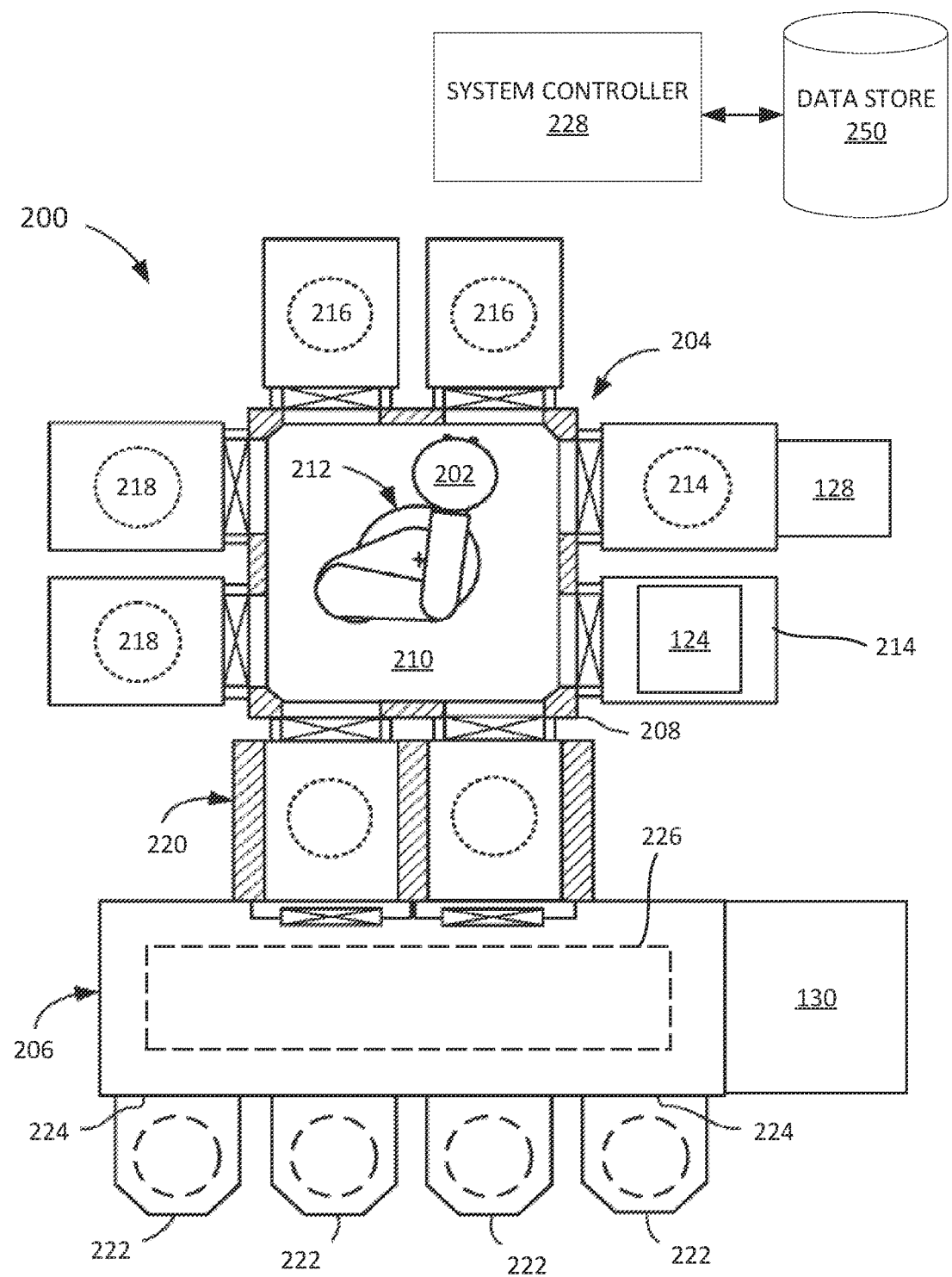
FIG. 2 is a top schematic view of an example manufacturing system, according to aspects of the present disclosure.

FIG. 2 is a top schematic view of an example manufacturing system 200. Manufacturing system 200 can perform one or more processes on a substrate 202. Substrate 202 can be any suitably rigid, fixed-dimension, planar article, such as, e.g., a silicon-containing disc or wafer, a patterned wafer, a glass plate, or the like, suitable for fabricating electronic devices or circuit components thereon, according to aspects of the present disclosure. In some embodiments, manufacturing system 200 can be include or be a part of computer system architecture 110, in accordance with embodiments described with respect to FIG. 1.

Manufacturing system 200 can include a process tool 204 and a factory interface 206 coupled to process tool 204. Process tool 204 can include a housing 208 having a transfer chamber 210 therein. Transfer chamber 210 can include one or more processing chambers (also referred to as process chambers) 214, 216, 218 disposed therearound and coupled thereto. Processing chambers 214, 216, 218 can be coupled to transfer chamber 210 through respective ports, such as slit valves or the like. Transfer chamber 210 can also include a transfer chamber robot 212 configured to transfer substrate 202 between process chambers 214, 216, 218, load lock 220, etc. Transfer chamber robot 212 can include one or multiple arms where each arm includes one or more end effectors at the end of each arm. The end effector can be configured to handle particular objects, such as wafers.

In some embodiments, transfer chamber 210 can also include metrology equipment, such as integrated metrology equipment 128, described with respect to FIG. 1. Integrated metrology equipment 128 can be configured to generate metrology data associated with substrate 202 before or during a substrate process, while the substrate is maintained in a vacuum environment. As illustrated in FIG. 2, integrated metrology equipment 128 can be disposed within transfer chamber 210. In other or similar embodiments, integrated metrology equipment 128 can be coupled to transfer chamber 210. As integrated metrology equipment 128 is disposed within or coupled to transfer chamber 210, metrology data associated with substrate 202 can be generated without substrate 202 being removed from the vacuum environment (e.g., transferred to factory interface 206.

Process chambers 214, 216, 218 can be adapted to carry out any number of processes on substrates 202. A same or different substrate process can take place in each processing chamber 214, 216, 218. A substrate process can include atomic layer deposition (ALD), physical vapor deposition (PVD), chemical vapor deposition (CVD), etching, annealing, curing, pre-cleaning, metal or metal oxide removal, or the like. Other processes can be carried out on substrates therein. In some embodiments, endpoint detection equipment, such as endpoint detection equipment 124 described with respect to FIG. 1, can be coupled to or disposed within a process chamber 214, 216, 218. Endpoint detection equipment 124 can be configured to collect spectral data for a profile of a surface of the substrate during a substrate process. A processing device coupled to endpoint detection equipment 124 (e.g., system controller 228) can determine, based on the collected spectral data, whether an endpoint of the etch process has been reached (i.e., whether a target profile has been etched onto the surface of the substrate). In some embodiments, the one or more components of endpoint detection equipment 124 can include components described with respect to FIG. 5 (e.g., optical fiber bundle, collimator assembly, etc.). In other or similar embodiments, endpoint detection equipment 124 can include one or more sensors disposed within or outside of process chambers 214, 216, 218 and configured to collect spectral data for a portion of substrate 202 and/or an environment within process chamber 214, 216, 218, before, after, or during a substrate process.

A load lock 220 can also be coupled to housing 208 and transfer chamber 210. Load lock 220 can be configured to interface with, and be coupled to, transfer chamber 210 on one side and factory interface 206 on another side. Load lock 220 can have an environmentally-controlled atmosphere that can be changed from a vacuum environment (wherein substrates can be transferred to and from transfer chamber 210) to an atmospheric-pressure (or near atmospheric-pressure) inert-gas environment (wherein substrates can be transferred to and from factory interface 206), in some embodiments.

Factory interface 206 can be any suitable enclosure, such as an Equipment Front End Module (EFEM). Factory interface 206 can be configured to receive substrates 202 from substrate carriers 222 (e.g., Front Opening Unified Pods (FOUPs)) docked at various load ports 224 of factory interface 206. A factory interface robot 226 (shown dotted) can be configured to transfer substrates 202 between substrate carriers (also referred to as containers) 222 and load lock 220. In other and/or similar embodiments, factory interface 206 can be configured to receive replacement parts from replacement parts storage containers 222.

In some embodiments, manufacturing system 200 can include metrology equipment that is configured to generate metrology data associated with substrate 202 outside of the vacuum environment. For example, as illustrated in FIG. 2, integrated metrology equipment 128 can be coupled to a process chamber (e.g., process chamber 214, 216, and/or 218). Integrated metrology equipment 128 can be configured to generate metrology data associated with substrate 202 prior to substrate 202 being placed in the vacuum environment (e.g., transferred to load lock 220) and/or after substrate 202 is removed from the vacuum environment (e.g., removed from load lock 220). It should be noted that although FIG. 2 depicts inline metrology equipment 130 coupled to factory interface 206, inline metrology equipment 130 can be coupled to any part of the process tool 204 that is outside of the vacuum environment (e.g., coupled to load lock 220, etc.).

Manufacturing system 200 can also be connected to a client device (e.g., client device 120 of FIG. 1) that is configured to provide information regarding manufacturing system 200 to a user (e.g., an operator). In some embodiments, the client device can provide information to a user of manufacturing system 200 via one or more graphical user interfaces (GUIs). For example, the client device can provide information regarding an endpoint of a substrate process performed at process chamber 214, 216, 218 via a GUI.

Manufacturing system 200 can also include or be coupled to a system controller 228. System controller 228 can be and/or include a computing device such as a personal computer, a server computer, a programmable logic controller (PLC), a microcontroller, and so on. System controller 228 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. System controller 228 can include a data storage device (e.g., one or more disk drives and/or solid state drives), a main memory, a static memory, a network interface, and/or other components. System controller 228 can execute instructions to perform any one or more of the methodologies and/or embodiments described herein. In some embodiments, system controller 228 can execute instructions to perform one or more operations at manufacturing system 300 in accordance with a process recipe. The instructions can be stored on a computer readable storage medium, which can include the main memory, static memory, secondary storage and/or processing device (during execution of the instructions).

In some embodiments, system controller 228 can receive data from sensors or other components (e.g., endpoint detection equipment 124) included on or within various portions of manufacturing system 300 (e.g., processing chambers 214, 216, 218, transfer chamber 210, load lock 220, etc.). Data received by the system controller 228 can include spectral data and/or non-spectral data for a portion of substrate 302. For purposes of the present description, system controller 228 is described as receiving data from endpoint detection equipment 124 coupled to or disposed within process chambers 214, 216, 218. However, system controller 228 can receive data from any portion of manufacturing system 200 and can use data received from the portion in accordance with embodiments described herein. In an illustrative example, system controller 228 can receive spectral data from an endpoint detection equipment 124 coupled to a process chamber 214, 216, 218 before, after, or during a substrate process at the processing chamber 214, 216, 218. Data received from endpoint detection equipment 124 or other sensors at manufacturing system 200 can be stored in a data store 250. Data store 250 can be included as a component within system controller 228 or can be a separate component from system controller 228. In some embodiments, data store 250 can be or include a portion of data store 150, as described with respect to FIG. 1.

Figure 3:
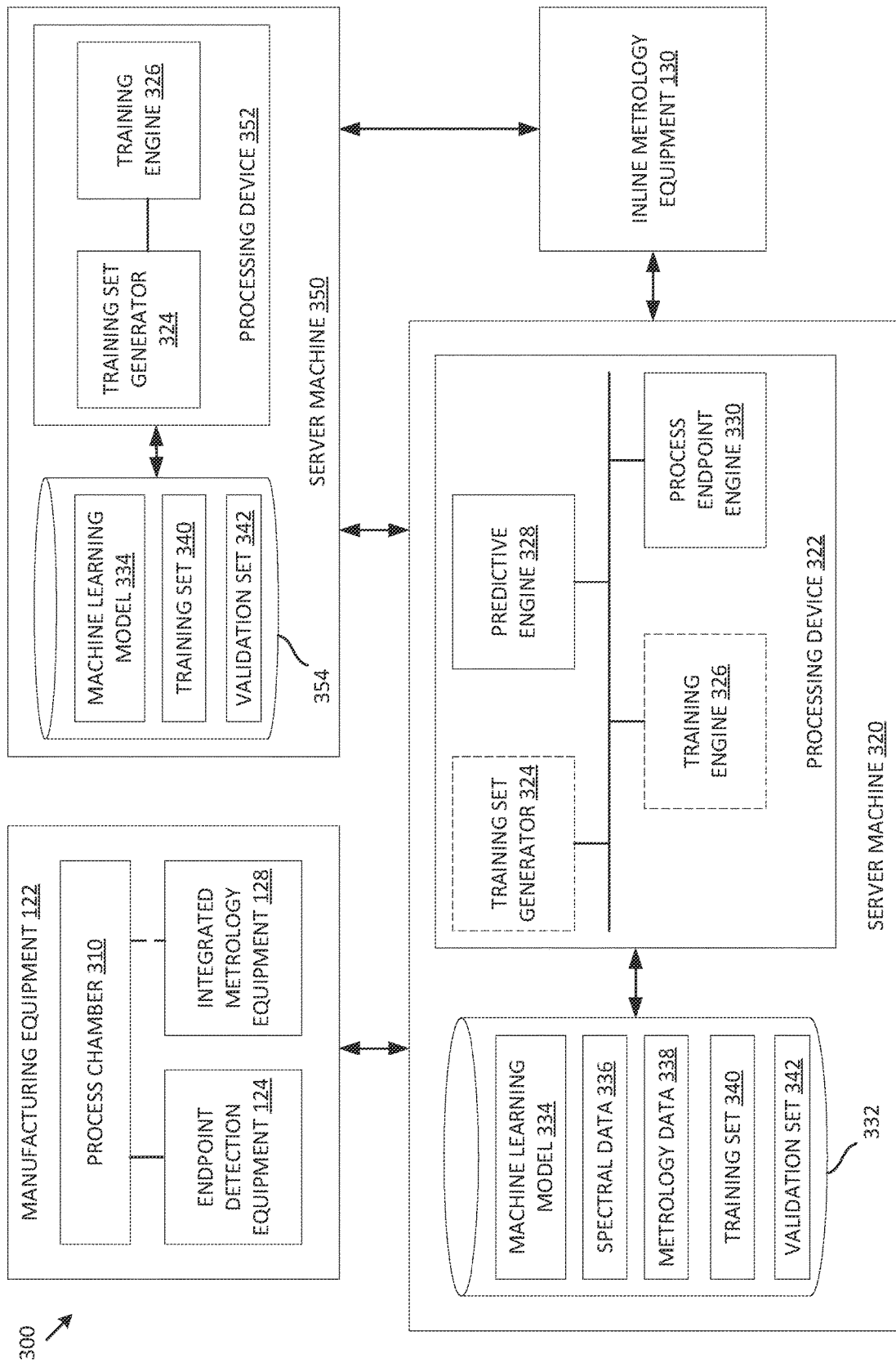
FIG. 3 depicts an illustrative system architecture for endpoint detection of a substrate process, according to aspects of the present disclosure.

FIG. 3 depicts an illustrative system architecture 300 for endpoint detection of a substrate process, according to aspects of the present disclosure. In some embodiments, endpoint detection system 300 can include or be a part of one or more components of computer architecture 100 and/or manufacturing system 200. Endpoint detection system 300 can include one or more components of manufacturing equipment 124 (e.g., endpoint detection equipment 126), metrology equipment 130, server machine 320, and server machine 350.

As described previously, manufacturing equipment 122 can produce products following a recipe or performing runs over a period of time. Manufacturing equipment 122 can include a process chamber 310 configured to perform a substrate process for a substrate according to a substrate process recipe. In some embodiments, process chamber 310 can be any of process chamber 214, 216, 218, described with respect to FIG. 2. Manufacturing equipment 122 can also include endpoint detection equipment 124, as described herein. Endpoint detection equipment 124 can be coupled to or disposed within process chamber 310 and can collect spectral data to be used to detect an endpoint of a step of the substrate process recipe. In some embodiments, manufacturing equipment 122 can also include integrated metrology equipment 128, as described herein. Integrated metrology equipment 128 can be configured to generate metrology data associated with the substrate before or after the substrate process is completed.

Manufacturing equipment 122 can be coupled to server machine 320. Server machine 320 can include processing device 322 and/or data store 332. In some embodiments, processing device 322 can be configured to execute one or more instructions to perform operations at manufacturing equipment 122. For example, processing device 322 can include or be a part of system controller 228, described with respect to FIG. 2. Data store 332 can include or be part of data store 150 and/or data store 250, in some embodiments.

Processing device 322 can be configured to receive data from one or more components of manufacturing equipment 122 (i.e., via a network). For example, processing device 322 can receive spectral data 336 collected by endpoint detection equipment 124 during a substrate process for a substrate at process chamber 310. In another example, processing device 322 can receive metrology data 338 collected by integrated metrology equipment 128 before and/or after the substrate process for the substrate. Metrology data 338 can include a metrology measurement value generated for the substrate by integrated metrology equipment 128. In some embodiments, processing device 322 can store the received spectral data and/or the received metrology data 338 at data store 332.

In some embodiments, processing device 322 can receive metrology data 338 from other metrology equipment. For example, in some embodiments, server machine 320 can be coupled to inline metrology equipment 130 (i.e., via a network). A substrate can be removed from process chamber 210 and transferred to inline metrology equipment 130, as described herein. Inline metrology equipment 130 can generate metrology data 338 for the substrate and transmit the generated metrology data 338 to processing device 322 via the network. In another example, the substrate can be removed from manufacturing equipment 122 and can be transferred to external metrology equipment, such as external metrology equipment 132 described with respect to FIG. 1. A client device, such as client device 120, can be coupled to server machine 320 (i.e., via the network). In some embodiments, a user of manufacturing equipment 122 can obtain metrology data 338 using external metrology equipment 132 and can provide the obtained metrology data 338 via a GUI of client device 120. Client device 120 can transmit metrology data 338 via the network. In additional or alternative embodiments, external metrology equipment 132 can be coupled to server machine 320 via the network and external metrology equipment 132 can transmit metrology data 338 directly to processing device 332.

Processing device 322 can include a predictive engine 328 and a process endpoint engine 330. Predictive engine 328 can be configured to provide a value for a metrology measurement based on spectral data 336 collected for a substrate during a substrate process. For example, predictive engine 328 can provide spectral data 336 collected for a current process performed for a current substrate at process chamber 310 as input to a trained machine learning model 334. Predictive engine 328 can obtain, as an output of machine learning model 334, metrology data 338 including an indication of the metrology measurement value that corresponds to the current substrate. In some embodiments, predictive engine 328 can correspond to predictive engine 114, described with respect to FIG. 1.

As illustrated in FIG. 3, processing device 322 can include a training set generator 324 and/or a training engine 326, in some embodiments. In some embodiments, training set generator 324 can correspond to training set generator 172 and/or training engine 326 can correspond to training engine 182, described with respect to FIG. 1. Training set generator 324 can be configured to generate training sets 340 to train machine learning model 334 or a set of machine learning models 334. For example, training set generator 324 can generate a training input based on historical spectral data 336 associated with a prior substrate. In some embodiments, training set generator 324 can retrieve the historical spectral data 336 from data store 332 to generate the training input. Training set generator 324 can generate a target output for the training input based on historical metrology data 338 obtained for the prior substrate. As described above, historical metrology data 338 can be generated by inline metrology equipment 128, integrated metrology equipment 130, or external metrology equipment 132. Training set generator 324 can include the generated training input and the generated target output in a training set 340. Further details regarding generating training set 340 are provided with respect to FIG. 4.

Training engine 326 can be configured to train, validate and/or test the machine learning model 334 or sets of machine learning models 334. Training engine 326 can provide training set 340 to train machine learning model(s) 334 and store trained machine learning model(s) 334 at data store 332. In some embodiments, training engine 326 can use a validation set 342 to validate a trained machine learning model 334. Validation set 342 can include spectral data 336 and metrology data 338 obtained for a prior substrate (i.e., processed at process chamber 310 or at another process chamber). Training set generator 324 and/or training engine 326 can generate validation set 342 based on historical spectral data 336 and historical metrology data 338 obtained for a prior substrate. In some embodiments, validation set 342 can include historical spectral data 336 and historical metrology data 338 that is different from historical spectral data 336 and historical metrology data 338 included in training set 340.

Training engine 326 can provide the spectral data 336 for the prior substrate as an input to a trained machine learning model 334 and can extract a metrology measurement value for the prior substrate from one or more outputs of the trained model 334. Training engine 336 can assign a performance score to the trained model 334 based on an accuracy of the metrology measurement value for the prior substrate in view a measured metrology value of the metrology data 338 for the prior substrate included in the validation set 342. Training engine 336 can select the trained model 334 to be used to provide future metrology measurement values for future substrates processed at the process chamber 310 in response to determining the performance score satisfies a performance score criterion (e.g., exceeds a performance score threshold). Further details regarding selecting a trained model 334 are provided with respect to FIG. 9.

As discussed previously, training set generator 324 and/or training engine 326 can be components of processing device 322 at server machine 320, in some embodiments. In additional or alternative embodiments, training set generator 324 and/or training engine 326 can be components of processing device 352 at server machine 350. Server 350 can include or be part of a computing system that is separate from manufacturing system 200. As described previously, server machine 320 can include or be part of system controller 228, described with respect to FIG. 2, in some embodiments. In such embodiments, server machine 350 can include or be part of a computing system that is coupled to system controller 228 (i.e., via a network), but is separate from system controller 228. For instance, a user of manufacturing system 200 may be provided with access to data stored at one or more portions of data store 332 or one or more processes executed at processing device 322. However, the user of manufacturing system 200 may not be provided with access to any data stored at one or more portions of data store 354 or any processes executed at processing device 352.

Processing device 352 can be configured to execute training set generator 324 and/or training engine 326 in a similar fashion as processing device 322. In some embodiments, server 350 can be coupled to manufacturing equipment 122 and/or inline metrology equipment 130 via a network. As such, processing device 352 can obtain spectral data 336 and metrology data 338 to be used by training set generator 324 and/or training engine 326 to generate training set 340 and validation set 342, in accordance with embodiments described with respect to processing device 322. In other or similar embodiments, server 350 is not coupled to manufacturing equipment 122 and/or external metrology equipment 130. Accordingly, processing device 352 can obtain spectral data 336 and/or metrology data 338 from processing device 322. For example, processing device 322 can receive spectral data 336 from endpoint detection equipment 124, as previously described. Processing device 322 can transmit the received spectral data 336 to processing device 352 (i.e., via a network). Processing device 352 can store spectral data 336 at data store 352, in some embodiments. In some embodiments, processing device 322 can similarly transmit metrology data 338 obtained for a substrate to processing device 352. For example, processing device 322 can receive metrology data 338 from inline metrology equipment 128, integrated metrology equipment 130 and/or external metrology equipment 132, as previously described. Processing device 352 can transmit the received metrology data 338 from processing device 322 and, in some embodiments, store metrology data 338 at data store 354.

Training set generator 324 at processing device 352 can generate training set 340 in accordance with previously described embodiments. Training engine 326 at processing device 352 can train and/or validate machine learning model 340, in accordance with previously described embodiments.

In some embodiments, server 350 can be coupled to other manufacturing equipment and/or other server machines that are different from manufacturing equipment 122 and/or server machine 320. Processing device 352 can obtain spectral data 336 and/or metrology data 338 from the other manufacturing equipment and/or server machines, in accordance with embodiments described herein. In some embodiments, training set 340 and/or validation set 342 can be generated based on spectral data 336 and metrology data 338 obtained for substrates processed at process chamber 310 as well as other spectral data and metrology data obtained for other substrates processed at process chambers at other manufacturing systems.

In response to training engine 326 selecting trained model 334 to be applied to future spectral data for future substrates at process chamber 310, processing device 352 can transmit trained model 334 to processing device 322. Predictive engine 328 can use trained model 334 to provide metrology measurement values for future substrates at process chamber 310, as previously described.

Process endpoint engine 330 at processing device 322 can be configured to detect an endpoint of a process performed for a substrate at process chamber 310. Process endpoint engine 330 can obtain a metrology measurement value for a current substrate at process chamber 310 from predictive engine 328. In response to determining that the metrology measurement value satisfies a metrology measurement criterion (e.g., corresponds to a target metrology measurement value), process endpoint engine 330 can generate an instruction including a command to terminate the current process (or the current step of the current process) at the process chamber 310. Processing device 322 can transmit the instruction to manufacturing equipment 122, causing the current process to be terminated for the current substrate. In response to determining that the metrology measurement criterion is not satisfied, process endpoint engine 330 can allow the current process to continue for the current substrate (e.g., not generate an instruction to terminate the process). Further details associated with detecting the endpoint of the current process are provided with respect to FIG. 10.

Figure 4:
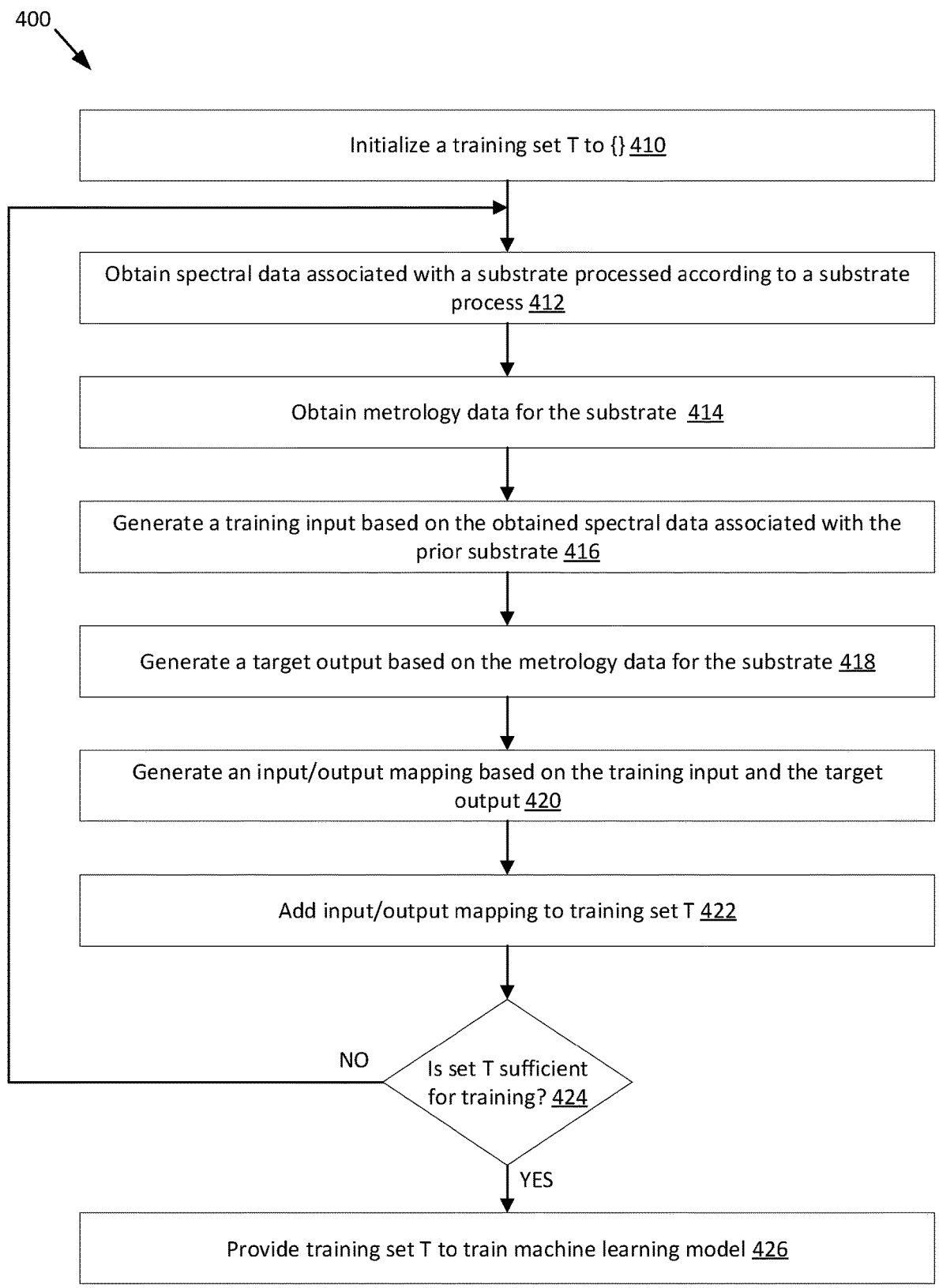
FIG. 4 is a flow chart of a method for training a machine learning model, according to aspects of the present disclosure.

FIG. 4 is a flow chart of a method 400 for training a machine learning model, according to aspects of the present disclosure. Method 400 is performed by process logic that can include hardware (circuitry, dedicated logic, etc.), software (such as is run on a general purpose computer system or a dedicated machine), firmware, or some combination thereof. In one implementation, method 400 can be performed by a computer system, such as computer system architecture 100 of FIG. 1. In other or similar implementations, one or more operations of method 400 can be performed by one or more other machines not depicted in the figures. In some aspects, one or more operations of method 400 can be performed by training set generator 324 of server machine 320 or server machine 350, described with respect to FIG. 3.

Figure 5:
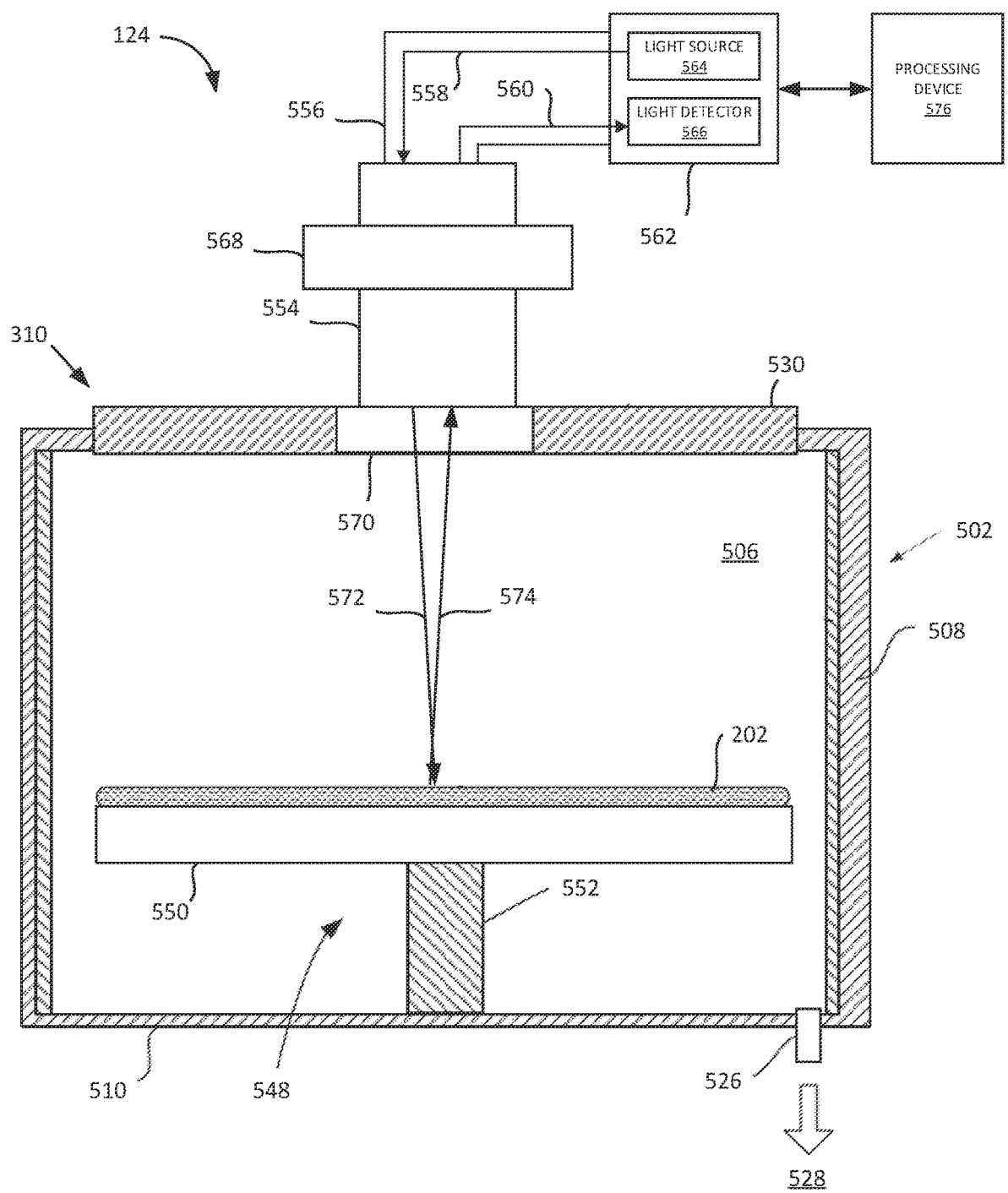
FIG. 5 is a cross-sectional schematic side view of endpoint detection equipment, according to aspects of the present disclosure.

At block 410, process logic initializes a training set T to an empty set (e.g., { }). At block 412, process logic obtains spectral data associated with a substrate processed at a process chamber of a manufacturing system. In some embodiments, the spectral data can be received from one or more sensors disposed within or coupled to the process chamber. In other or similar embodiments, the spectral data can be received from endpoint detection equipment disposed within or coupled to the process chamber. FIG. 5 is a cross-sectional schematic side view of endpoint detection equipment 124 coupled to a process chamber 310, according to aspects of the present disclosure. In some embodiments, process chamber 310 can be used for processes in which a corrosive plasma environment is provided. For example, the process chamber 310 can be a chamber for a plasma etcher or plasma etch reactor, a plasma cleaner, and so forth. In other or similar embodiments, process chamber 310 can be used for processes in which a non-corrosive environment is provided. For example, process chamber 310 can be used as a chemical vapor deposition (CVD) chamber, a physical vapor deposition (PVD) chamber, an atomic layer deposition (ALD) chamber, an ion assisted deposition (IAD) chamber, and other types of processing chambers.

Briefly, process chamber 310 includes a chamber body 502 and a lid 530 and/or a showerhead (not shown) that encloses an interior volume 506. Chamber body 502 generally includes sidewalls 508 and a bottom 510. The showerhead can include a showerhead base and a showerhead gas distribution plate. The lid 530 and/or the showerhead can be supported on sidewall 508 of the chamber body 502. The lid 530 (or showerhead) can be opened to allow access to the interior volume 506 of process chamber 510, and can provide a seal for the process chamber 510 while closed. A gas panel (not shown) can be coupled to process chamber 510 to provide process and/or cleaning gases to interior volume 506 through lid 530 and a nozzle (e.g., through apertures of the showerhead or lid and nozzle) and/or the showerhead. An exhaust port 526 can be defined in chamber body 502, and can couple interior volume 506 to a pump system 528. Pump system 528 can include one or more pumps and throttle valves utilized to evacuate and regulate the pressure of interior volume 506 of process chamber 510. A substrate support assembly 548 is disposed in interior volume 506 and beneath lid 530 and/or the showerhead. Substrate support assembly 548 holds a substrate, such as substrate 202 of FIG. 2, during processing. In one embodiment, substrate support assembly 548 includes a pedestal 552 that supports an electrostatic chuck 550.

Endpoint detection equipment 124 can be configured to optically monitor an environment of interior volume 506 during a substrate process for substrate 202. In some embodiments, endpoint detection equipment 124 can be mechanically coupled to chamber body 502 and optically interfaced (i.e., via optical interface 570) with the environment of interior volume 506. Endpoint detection equipment 124 can include a collimator assembly 554, an optical fiber bundle 556, a light component 562, a processing device 576 and, in some embodiments, a polarizer component 586. As illustrated in FIG. 5, collimator assembly 554 can be coupled to chamber interface 570. In some embodiments, chamber interface 570 can be an orifice, a converging or diverging lens, a transparent slab, or any other device or material that is capable of transferring light between collimator assembly 554 and the environment of interior volume 506. It should be noted that although FIG. 5 depicts chamber interface 570 as being embedded within lid 530, chamber interface 570 can be embedded within or coupled to any portion of process chamber 310 (e.g., sidewall 508, bottom 510, etc.).

A first end of optical fiber bundle 556 can be coupled to collimator assembly 554 and a second end of optical fiber bundle 556 can be coupled to light component 562. Light component 562 can include a light source 564 configured to generate light. Herein, "light" refers to electromagnetic radiation of any spectral range, including visible, far and near infrared (IR), far and near ultraviolet (UV), and so forth. "Light" can further include unpolarized (e.g., natural) light, linearly, circularly, or elliptically polarized light, partially-polarized light, focused light, diverging light, collimated light, and so on. In some embodiments, light source 564 can include a narrow-band light source, such as a light-emitting diode (LED), a laser, a light bulb, etc. In other or similar embodiments, light source 564 can include a broadband light source. Light source 564 can include more than one component light sources, such as multiple narrow-band light sources producing (when taken together) a broadband light input, in some embodiments. Light source 564 can include additional optical elements (i.e., filters, absorbers, polarizers, etc.) to control a spectral distribution and/or polarization of the light.

Light generated by light source 564 (referred to as input light herein) can be transmitted to collimator assembly 554 through one or more emitting optical fibers 558 of optical bundle 556. In response to receiving the input light via emitting optical fibers 558, collimator assembly 554 can be configured to convert the input light into a light beam 572. For example, the input light can pass via one or more optical elements of collimator assembly 554, such as lenses, reflectors, filters, apertures, and so forth. In some embodiments, spatial properties of the light beam produced by collimator assembly 554 can be the same for multiple spectral components of light beam 572. For example, a diameter of light beam 572 can be the same within a broad range of wavelengths $\lambda$ of various spectral components contained in the input light and, therefore in light beam 572. In some embodiments, collimator assembly 554 can include one or more achromatic lenses. Accordingly, the light beam 572 generated by collimator assembly 554 can be an achromatic light beam.

As illustrated in FIG. 5, in some embodiments, collimator assembly 554 can include a polarizer component 568. Polarizer component 568 is configured to polarize unpolarized (e.g., natural) light generated by light source 564. For example, polarizer component 568 can convert unpolarized input light into linearly, circularly, or elliptically polarized light. It should be noted that although FIG. 5 illustrates polarizer component 568 as being part of collimator assembly 554, polarizer component 568 can be coupled to any portion of endpoint detection equipment 124 that passes input light to optical interface 570. For example, polarizer component 568 can be coupled to an outlet of light source 564, to an outlet of the one or more emitting optical fibers 558, between collimator assembly and optical interface 570, etc.

Collimator 572 can direct light beam 572 to a surface of substrate 202 disposed on substrate support assembly 548 via optical interface 570. Light beam 572 can be reflected off the surface of substrate 202 as reflected light beam 574, which is received by collimator assembly 554. One or more receiving optical fibers 560 of optical bundle 556 can transmit reflected light beam 574 to light detector 566 of light component 562. Light detector 566 can include one or more spectrographs, spectrometers, diffraction gratings, mirrors, lenses, photodiodes, and other devices. Light detector 566, alone or in conjunction with processing device 576, can determine one or more optical responses associated with the surface of substrate 202 based on reflected light beam 574. For example, light detector 566 and/or processing device 576 can determine a reflectivity $R(\lambda)$, a refraction index $n(\lambda)$, or any other optical quantity that can be used to characterize substrate 202 based on reflected light 574. In some embodiments, the optical responses can be used to characterize, for substrate 202, a polarization dependence of the reflectivity, an angle of rotation of the polarization plane upon reflection, luminescence intensity, and so on. Spectral data, as described with respect to this application, can refer to data corresponding to the optical responses of reflected light beam 574 and/or the optical characteristics for substrate 202 derived from the optical responses of reflected light beam 574.

In some embodiments, processing device 576 can be included as part of a system controller (e.g., system controller 228) for a manufacturing system including process chamber 310. In such embodiments, processing device 576 can store the spectral data generated for substrate 202 at data store coupled to processing device 576 (e.g., data stores 250, 332, 352, etc.). In other or similar embodiments, processing device 576 can be a processing component that is separate from the system controller but is coupled to the system controller via a network. Processing device 576 can transmit the generated spectral data to the system controller for storage at a respective data store of the manufacturing system.

Referring back to FIG. 4, At block 414, process logic obtains metrology data for the substrate. As described previously, metrology data can include a value of one or more of film property data (e.g., wafer spatial film properties), dimensions (e.g., thickness, height, etc.), dielectric constant, dopant concentration, density, defects, etc. In some embodiments, the metrology data can further include a value of one or more surface profile property data (e.g., an etch rate, an etch rate uniformity, a critical dimension of one or more features included on a surface of the substrate, a critical dimension uniformity across the surface of the substrate, an edge placement error, etc.). In some embodiments, the metrology measurements can be received from metrology equipment of manufacturing system 200 (e.g., inline metrology equipment 126, integrated metrology equipment 128, etc.). For example, after the substrate process is completed, the substrate can be transferred to inline metrology equipment 128 or integrated metrology equipment 130 of manufacturing system 200. Inline metrology equipment 128 or integrated metrology equipment 130 can generate metrology data associated with the substrate and can transmit the metrology data to a computing device including the process logic (e.g., server machine 320, server machine 350, etc.) via a network. In other or similar embodiments, the metrology measurements can be received from metrology equipment that is separate from manufacturing system 200 (e.g., external metrology equipment 132), as described herein.

At block 416, process logic generates a training input based on the spectral data obtained for the substrate at block 412. In some embodiments, the training input can include a normalized set of spectral data generated based on the spectral data obtained for the substrate. The normalized set of spectral data can include one or more spectral features that correspond to a particular type of metrology measurement. Further details regarding generating the training input are described with respect to FIG. 6. At block 418, process logic can generate a target output based on the metrology data obtained for the substrate at block 414. The target output can correspond to a value for a metrology measurement associated with the substrate. For example, at block 414, process logic can obtain metrology data indicating a thickness of a film at one or more portions of a surface for a substrate after an etch process. Process logic can generate a target output corresponding to an etch rate and/or an etch rate uniformity based on the obtained metrology data and process data for the etch process.

At block 420, process logic generates an input/output mapping. The input/output mapping refers to the training input that includes or is based on data for the substrate, and the target output for the training input, where the target output identifies a metrology measurement value for the substrate, and where the training input is associated with (or mapped to) the target output. At block 422, process logic adds the input/output mapping to the training set T.

At block 424, process logic determines whether the training set, T, includes a sufficient amount of training data to train a machine learning model. It should be noted that in some implementations, the sufficiency of training set T can be determined based simply on the number of input/output mappings in the training set, while in some other implementations, the sufficiency of training set T can be determined based on one or more other criteria (e.g., a measure of diversity of the training examples, etc.) in addition to, or instead of, the number of input/output mappings. Responsive to determining the training set, T, includes a sufficient amount of training data to train the machine learning model, process logic provides the training set, T, to train the machine learning model. Responsive to determining the training set does not include a sufficient amount of training data to train the machine learning model, method 400 returns to block 412.

At block 426, process logic provides the training set T to train the machine learning model. In some embodiments, the training set T is provided to training engine 326 of server machine 320 and/or server machine 350 to perform the training. In the case of a neural network, for example, input values of a given input/output mapping (e.g., spectral data for a previous substrate) are input to the neural network, and output values of the input/output mapping are stored in the output nodes of the neural network. The connection weights in the neural network are then adjusted in accordance with a learning algorithm (e.g., backpropagation, etc.), and the procedure is repeated for the other input/output mappings in the training set T. After block 426, machine learning model 190 can be used to provide metrology values for future substrates processed at the manufacturing system (for example, in accordance with method 800 of FIG. 8 described below).

Figure 6:
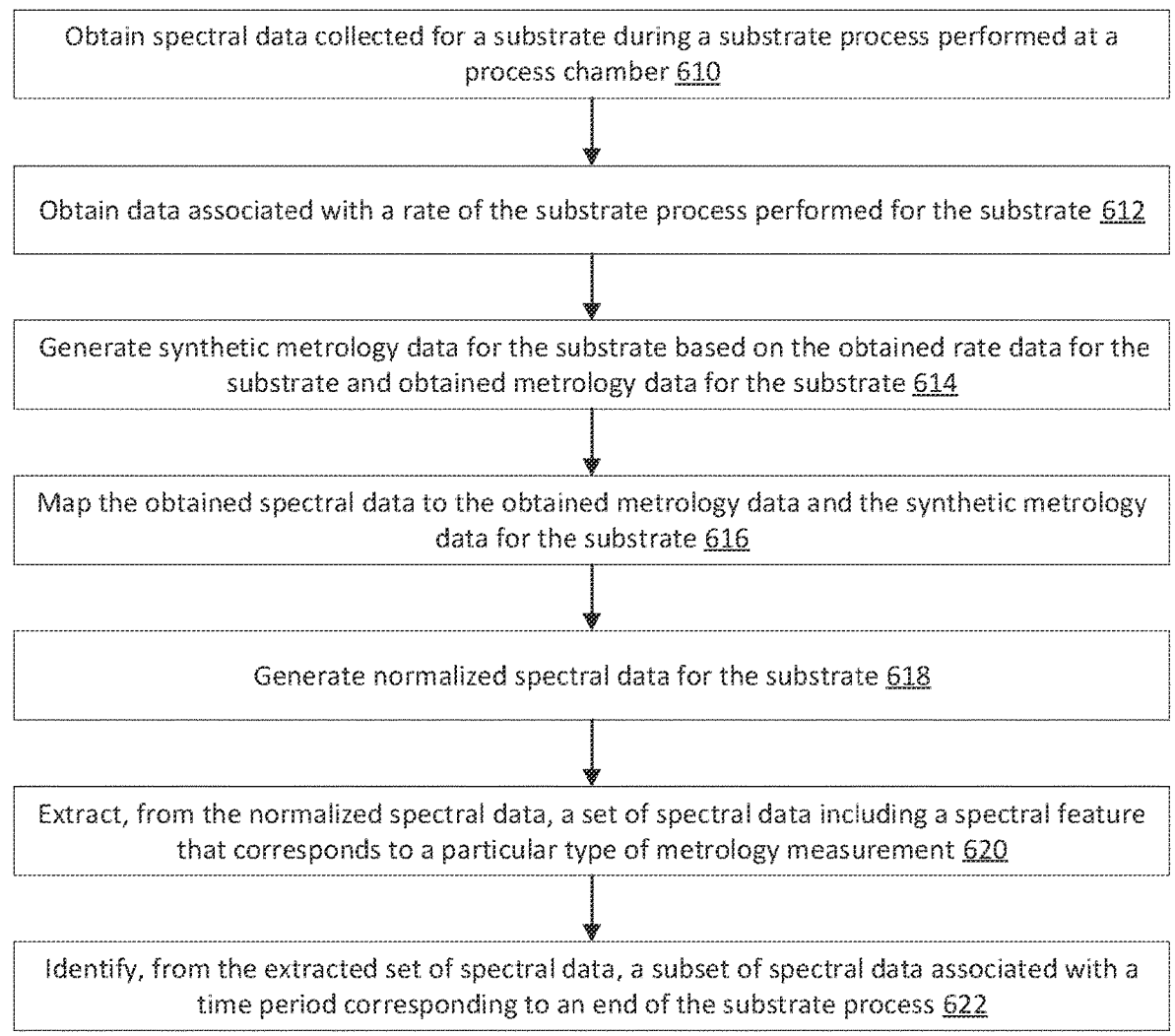
FIG. 6 is a flow chart of a method for obtaining data for use with a machine learning model, according to aspects of the present disclosure.

FIG. 6 is a flow chart of a method 600 for obtaining data for use with a machine learning model (e.g., machine learning model 334), according to aspects of the present disclosure. Method 600 is performed by process logic that can include hardware (circuitry, dedicated logic, etc.), software (such as is run on a general purpose computer system or a dedicated machine), firmware, or some combination thereof. In one implementation, method 600 can be performed by a computer system, such as computer system architecture 100 of FIG. 1. In other or similar implementations, one or more operations of method 600 can be performed by one or more other machines not depicted in the figures. In some aspects, one or more operations of method 600 can be performed by training set generator 324 of server machine 320 or server machine 350, described with respect to FIG. 3. Additionally or alternatively, one or more operations of method 600 can be performed by predictive engine 328 of server machine 350. In one example, training set generator 324 can perform operations described with respect to one or more of blocks 610-622 to generate a training input, in accordance with embodiments described with respect to method 400 of FIG. 4. In another example, predictive engine 328 can perform operations described with respect to one or more of blocks 620-622 to obtain subsets of spectral data to be provided as input to a trained machine learning model, as described with respect to method 800 of FIG. 8.

At block 610, process logic can obtain spectral data associated with a substrate. In some embodiments, the spectral data can correspond to the spectral data obtained by process logic for training set generator 324 as described with respect to block 412 of method 400. In other or similar embodiments, the spectral data can correspond to the spectral data obtained by process logic for predictive engine 328, as described herein. FIG. 7A illustrates spectral data collected for a substrate during a substrate process, in accordance with embodiments described herein. As illustrated in FIG. 7A, spectral data can correspond to an amplitude of a light wave having a particular wavelength of a light signal, as detected by sensors or endpoint detection equipment disposed within or coupled to a process chamber during respective time periods of a substrate process. For example, spectral data can correspond to an amplitude of wavelengths X, Y, and Z as detected by endpoint detection equipment 124 during initial (e.g., at time 0 seconds), intermediate (e.g., at time 1 seconds to time N−1 seconds) and final (e.g., at time N seconds) time periods of an etch process for a substrate.

Referring back to FIG. 6, in some embodiments, process logic can additionally obtain metrology data associated with the substrate. Process logic can obtain the metrology data in accordance with embodiments described with respect to block 414 of method 400.

At block 612, process logic can obtain data associated with a rate of the substrate process performed for the substrate. In some embodiments, the substrate process can be an etch process and the rate data can be an etch rate for the etch process. In other or similar embodiments, the substrate process can be a deposition process and the rate data can be a deposition rate for the deposition process. It should be noted that the substrate process can be another process other than an etch process and/or a deposition process and process logic can obtain corresponding rate data associated with the respective substrate process.

In some embodiments, process logic can obtain the rate data based on contextual data and/or metrology data for the substrate. For example, the obtained metrology data can indicate a thickness of a film deposited on a surface of the substrate before and/or after the substrate process. FIG. 7B illustrates example rate data for a substrate process, in accordance with embodiments described herein. Data point 702 indicates a thickness of a film deposited on a surface of a substrate before an etch process. Data point 704 indicates a thickness of the film after the substrate process. Process logic can obtain data point 704 based on metrology data collected for the substrate after the etch process, in accordance with embodiments described herein. In some embodiments, process logic can obtain data point 702 based on metrology data collected for the substrate before the etch process. In other or similar embodiments, process logic can obtain data point 702 based on data that is not generated by metrology equipment before the etch process. For example, a user of the manufacturing system can provide data associated with the thickness of the film (e.g., from a substrate specification) before the substrate process via a client device coupled to the manufacturing system. In another example, metrology equipment can generate metrology data for another substrate before another etch process is performed. Data point 702 can indicate the thickness of the film obtained based on the metrology data collected for the other substrate.

In some embodiments, process logic can obtain an indication of a length of the substrate process from contextual data associated with the substrate (e.g., stored at data store 150). For example, process logic can retrieve, from data store 150, data that indicates the etch process was initiated for the substrate at the initial time period of 0 seconds and the etch process was completed approximately at the final time period of N seconds. Accordingly, process logic can determine that the length of the etch process is approximately N seconds.

Process logic can determine the rate of the process based on a difference between the thickness of the film before and after the substrate process and the length of the substrate process. For example, process logic can determine that data point 702 corresponds to a film thickness 10 Angstroms (Å) and that data point 704 corresponds to a film thickness of 2 Å (i.e., 8 Å of film are etched away during the etch process). Based on the obtained contextual data, process logic can determine that the length of the etch process is 8 seconds. Accordingly, process logic can determine that the etch rate 706 for the etch process is approximately 1 Å/s.

It should be noted that, in some embodiments, process logic can determine the rate of the substrate process based by other techniques. In some embodiments, process logic can obtain the rate data for the substrate process based on data provided by a user of the manufacturing system. For example, the user of the manufacturing system can provide the etch rate of the etch process via a client device coupled to the manufacturing system. In other or similar embodiments, process logic determine the rate of the substrate process based on process recipe data associated with the substrate. In another example, process logic can obtain etch process recipe data from data store 150 and determine the etch rate for the etch process based on an amount of etching plasma generated at the process chamber at one or more time periods of the etch process. In some embodiments, process logic can also determine whether the process rate is constant for the duration for the substrate process. For example, the user can provide an indication that the etch rate is constant for the etch process via the client device. Alternatively, the user can provide an indication that the etch rate is not constant for the etch process and can provide an indication of the etch rate at each instance of time during the etch process. In another example, the process logic can determine whether the process rate is constant based on process recipe data, in accordance with previously described embodiments. If the process rate is not constant, the process logic can also determine the process rate based on the process recipe data (e.g., based on the amount of etching plasma generated at the process chamber at each instance of time during the etch process).

At block 614, process logic can generate synthetic metrology data for the substrate based on the obtained rate data for the substrate. In some embodiments, the synthetic metrology data for the substrate can correspond to an estimated thickness of the film on the surface of the substrate at one or more intermediate time periods between an initial time period of the substrate process and a final time period of the substrate process. In some embodiments, process logic can generate synthetic metrology data for each intermediate time period for which spectral data was generated for the substrate during the substrate process. FIG. 7C illustrates synthetic data 708 generated for the substrate, in accordance with embodiments described herein. As described with respect to FIG. 7B, process logic can determine an etch rate 706 for an etch process based on data point 702, data point 704, and the length of the etch process (e.g., obtained from contextual data for the etch process). Process logic can determine thickness of the film at other time periods during the etch process based on the determined etch rate 706. In accordance with the previously provided example, process logic can determine the length of the etch process to be approximately 8 seconds and the etch rate 706 to be approximately 1 Å/s. Accordingly, process logic can estimate that the film is approximately 9 Å thick one second after initiation of the etch process, approximately 8 Å thick two second after the initiation of the etch process, and so forth. The synthetic metrology data 708 can correspond to the estimated film thickness at each of a set of time periods between the initial time period and the final time period.

At block 616, process logic can map the obtained spectral data to the obtained metrology data and the synthetic metrology data for the substrate. As illustrated in FIG. 7D, process logic can map the obtained metrology data at initial and final time periods for the substrate process to spectral data collected during the respective time periods of the substrate process. For example, process logic can map the initial thickness of the film at the initial period for the etch process (i.e., data point 702) to the amplitude of each wavelength detected by endpoint detection equipment 124 at the initial period. Additionally or alternatively, process logic can map the generated synthetic metrology data associated with each respective intermediate time period of the etch process to the amplitude of each detected wavelength at the respective intermediate time period.

At block 618, process logic can generate normalized spectral data for the substrate. Normalized spectral data can refer to spectral data that is adjusted to account for differences that naturally result in data collected for substrate processes performed at different process chambers or at different instances of time (e.g., processes performed during a morning shift v. processes performed during an afternoon or evening shift). In some embodiments, process logic can generate normalized spectral data by selecting a set of spectral data as baseline spectral data. The baseline spectral data can be spectral data collected during an initial period of a substrate process, in some embodiments. Process logic can determine an amplitude of one or more wavelengths of the detected light signal based on the selected set of spectral data. In some embodiments, process logic can determine the amplitude of each wavelength of the detected light signal during the initial period of the substrate process. In other or similar embodiments, process logic can determine the amplitude of particular wavelengths of the detected light signal. For example, process logic can determine one or more particular wavelengths of the detected signal that correspond with particular metrology measurements of the metrology data for the substrate.

In some embodiments, process logic can determine the one or more wavelengths that correspond with the particular metrology measurements using a wave analysis model, such as a rigorous coupled-wave analysis (RCWA) model. The wave analysis model can be a theoretical model that is trained to provide spectral wavelengths (i.e., theoretical spectral wavelengths) that correspond to a metrology measurement value associated with the particular type of metrology measurement that has a higher degree of accuracy than other spectral wavelengths. For example, the wave analysis model can be trained to identify a range of spectral wavelengths. Some wavelengths of the range of spectral wavelengths can exhibit a distinct behavior than other wavelengths of the range of wavelengths, in view of the change of critical dimension across the surface of a substrate. Such spectral wavelengths can indicate the critical dimension measurement value with a higher degree of accuracy than other spectral wavelengths of the light signal detected by endpoint detection equipment 200. Process logic can provide one or more portions of the obtained spectral data as input to the wave analysis model and can obtain one or more outputs of the wave analysis model. Process logic can extract the range of spectral wavelengths that correspond to a particular metrology measurement from the one or more outputs. In some embodiments, the range of spectral wavelengths can correspond to a particular portion of a light spectrum. For example, the range of spectral wavelengths can correspond to a particular color (e.g., green) of the visible light spectrum. In additional or alternative embodiments, the range of spectral wavelengths can correspond to particular wavelengths of the light spectrum. In response to extracting the range of spectral wavelengths, process logic can select baseline spectral data for each of the range of spectral wavelengths to be included in the set of spectral data.

In response to determining the amplitude for the one or more wavelengths of the detected light signal at the initial time period, process logic can determine the amplitude for the one or more wavelengths for each subsequent time period at which spectral data was collected during the substrate process. As described above, endpoint detection equipment 124 can collect spectral data for the substrate at one or more intermediate time periods (e.g., at time 1 seconds to time N−1 seconds) and at a final time period (e.g., at time N seconds) of the etch process. Accordingly, process logic can determine the amplitude for each of the one or more wavelengths of the detected light signal at each intermediate time period and the final time period.

In some embodiments, process logic can generate the normalized spectral data for the substrate based on a difference between the amplitude of the one or more wavelengths at the initial time period and the amplitude of the one or more wavelengths at each subsequent time period (i.e., at each intermediate time period and the final time period) of the etch process. In an illustrative example, process logic can determine that the amplitude of wavelength X at the initial time period is approximately 10 units and the amplitude of wavelength X at a first intermediate time period is approximately 11 units. The normalized spectral data can include a first normalized spectral data point indicating that the normalized amplitude for wavelength X at the first intermediate time period is approximately 1unit (e.g., the difference between the amplitude of wavelength X at the initial time period and the amplitude of wavelength X at the second time period). Process logic can also determine the amplitude of wavelength X at a second intermediate time period is approximately 12 units. Accordingly, the normalized spectral data can include a second normalized spectral data point indicating that the normalized amplitude for wavelength X at the second intermediate time period is approximately 2 units. Process logic can generate the normalized spectral data for each intermediate time period and the final time period, in accordance with the example above.

In other or similar embodiments, process logic can generate the normalized spectral data for the substrate based on a ratio between the amplitude of the one or more wavelengths at each subsequent time period of the etch process and the amplitude of the one or more wavelengths at the initial time period. For example, process logic can determine that the amplitude of wavelength X at the initial time period is approximately 5 units and the amplitude of wavelength X at a first intermediate time period is approximately 10 units. The normalized spectral data can include a first normalized spectral data point indicating that the normalized amplitude for wavelength X at the first intermediate time period is approximately 2 units (e.g., the ratio between the amplitude of wavelength X at the second time period and the amplitude of wavelength X at the first time period).

FIG. 7D further illustrates example normalized spectral data that is mapped to obtained and synthetic metrology data for the substrate process. As described above, the normalized spectral data disregards any variances (e.g., process chamber differences, process run time differences, etc.) present in the raw spectral data collected by endpoint detection equipment 124. This is illustrated in FIG. 7D, where each line representing normalized spectral data for a respective wavelength smooth compared to each line representing the raw spectral data for the respective wavelength of FIG. 7A. As described above, in some embodiments, process logic can generate the normalized spectral data based on a difference between the amplitude of the one or more wavelengths at the initial time period and the amplitude of the one or more wavelengths at each subsequent time period. In such embodiments, at time 0, the magnitude of each wavelength is approximately 0 units. In other or similar embodiments, process logic can generate the normalized spectral data based on a ratio between the amplitude of the one or more wavelengths at each subsequent time period and the amplitude of the one or more wavelengths at the initial time period. In such embodiments, at time 0, the magnitude of each wavelength is approximately 1 unit.

Referring back to FIG. 6, at block 620, process logic can extract, from the normalized spectral data, a set of spectral data including one or more spectral features that corresponds to a particular type of metrology measurement. In some embodiments, process logic can perform principal component analysis (PCA) to select the most important features of the spectral data. A principal component analysis refers to an analysis of a collection of points in a real coordinate space to perform a change of basis on the collection of points. In some embodiments, the set of spectral features includes a range of wavelengths of the detected light that correspond with the particular type of metrology measurement. In such embodiments, process logic can identify the particular wavelengths based on an output of the wave analysis model, described above. For example, process logic can provide data associated with a structure of the substrate (e.g., CD, thickness, material property, SWA, etc.) as input to the wave analysis model and extract one or more outputs. Process logic can determine, based on the one or more outputs that a particular range of the light spectrum correspond to the particular type of metrology measurement and that wavelengths X and Y are included in the particular range. In additional or alternative embodiments, the outputs of the wave analysis model can indicate that wavelengths X and Y correspond to the particular type of metrology measurement. In response to identifying the particular wavelengths that correspond to the particular type of metrology measurement, process logic can extract a set of spectral data that corresponds to wavelengths X and Y from the normalized spectral data.

In some embodiments, the set of spectral features includes spectral trends or patterns that are present in spectral data for one or more wavelengths that correspond with the particular type of metrology measurement. Process logic can perform one or more analysis operations (e.g., RCWA, a two-dimensional scan operation, etc.) for normalized spectral data for the one or more wavelengths to identify spectral trends or patterns that correspond with the particular type of metrology measurement value. In some embodiments, process logic can identify a portion of the normalized spectral data for a particular wavelength that is associated with the particular type of metrology measurement. For example, process logic can identify that the normalized spectral data for wavelength Y between an initial time period and a first intermediate time period is associated with a critical dimension measurement. Data range 710 of FIG. 7E indicates such identified normalized spectral data. In other or similar embodiments, process logic can identify portions of normalized spectral data that indicate spectral trends or patterns that are common for each wavelength that is associated with the particular type of metrology measurement. For example, process logic can identify spectral trends that are common for wavelength X and wavelength Y. Data ranges 712, 714, and 716 of FIG. 7E indicate such identified normalized spectral data.

In other or similar embodiments, process logic can identify portions of normalized spectral data that correspond to the particular type of measurement value based on an outcome of a two-dimensional scan for a calibration substrate. A calibration substrate can refer to a substrate that includes one or more profile features that correspond to target profile features associated with a particular substrate process. The calibration substrate can be placed at scanning equipment (e.g., metrology equipment or other equipment) that is configured to scan the surface of the substrate and collect spectral data associated with a topography of the substrate profile. The collected spectral data can include sets of spectral data that are each associated with particular portions or regions of the substrate surface. Process logic can obtain the data for the calibration substrate and can identify, based on the sets of spectral data, a portion or region of the calibration substrate that includes a profile pattern that is distinct from other profile patterns at other portions of the substrate surface. Process logic can identify spectral trends of the normalized spectral data for wavelengths X, Y, and/or Z that corresponds to the spectral data for the distinct profile patterns collected during the two-dimensional scan for the calibration substrate.

Referring back to FIG. 6, at block 622, process logic can identify, from the extracted set of spectral data, a subset of spectral data associated with a particular time period of the substrate process. In some embodiments, the particular time period of the substrate process can include a final time period of the substrate process and/or one or more intermediate time periods of the substrate process that are adjacent to the final time period. In other or similar embodiments, the particular time period of the substrate process can include a time period that is closest to the current time period for a current substrate process. FIG. 7F illustrates a subset 718 of spectral data that is associated with the final time period (i.e., time N) of the etch process and an adjacent intermediate time period (i.e., time N−1) of the etch process. Process logic can identify subset 718 from data ranges 710-716 extracted from the normalized spectral data.

As described above, one or more operations of method 600 can be performed by training set generator 324. For example, training set generator 324 can perform operations 610-622 to obtain subset 718. Subset 718 can be included in the training input generated for training machine learning model 334, in accordance with embodiments provided with respect to FIG. 4. In other or similar embodiments, one or more operations of method 600 can be performed by predictive engine 328. For example, predictive engine 328 can perform operations 610 and 618-622 to obtain subset 718. Subset 718 can be provided as an input to trained machine learning model 334, in accordance with embodiments described with respect to FIG. 8 below.

Figure 8:
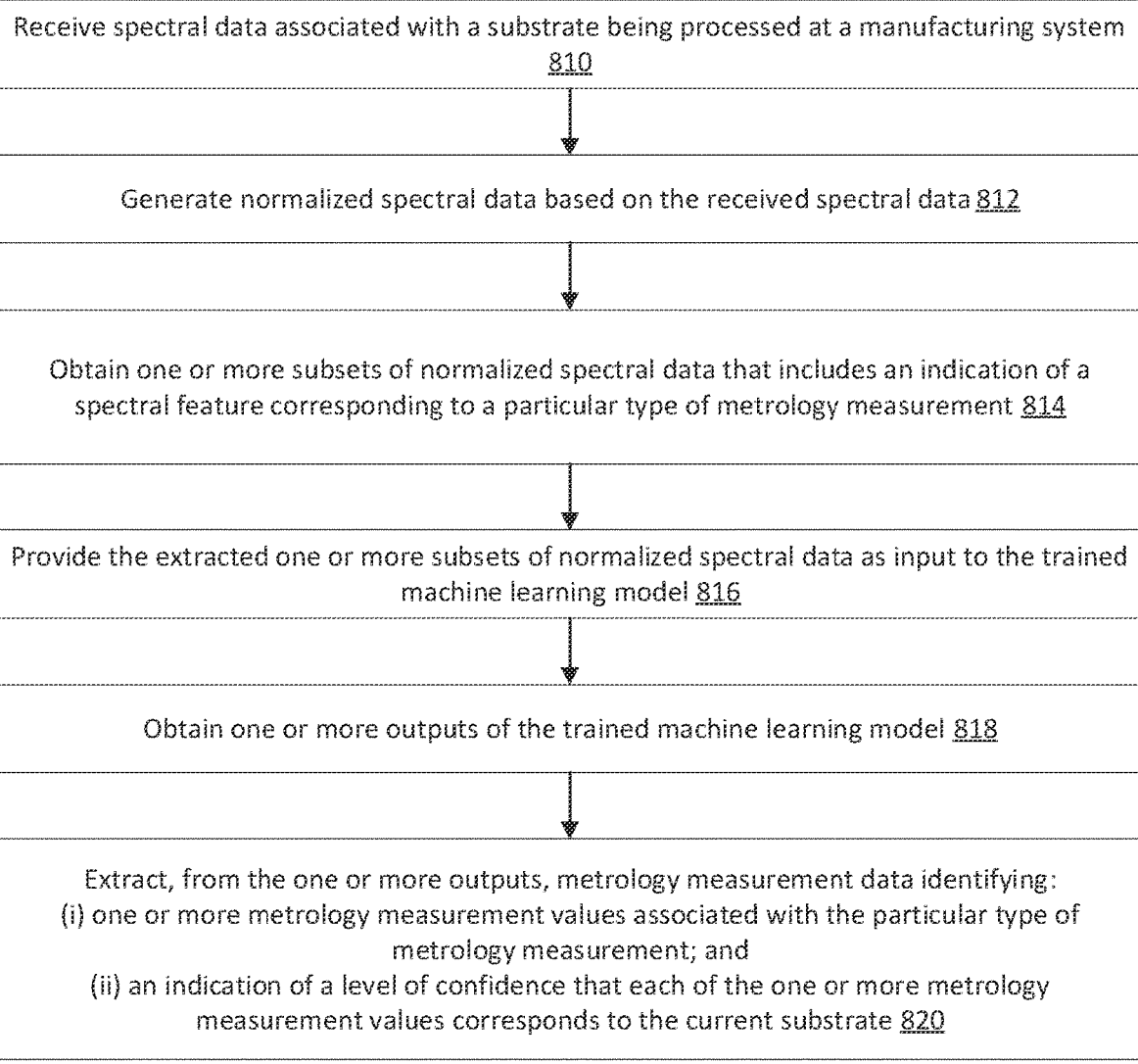
FIG. 8 is a flow chart of a method for estimating a metrology value for a profile of a substrate using a machine learning model, according to aspects of the present disclosure.

FIG. 8 is a flow chart of a method 800 for estimating a metrology value for a profile of a substrate using a machine learning model, according to aspects of the present disclosure. Method 800 is performed by process logic that can include hardware (circuitry, dedicated logic, etc.), software (such as is run on a general purpose computer system or a dedicated machine), firmware, or some combination thereof. In one implementation, method 800 can be performed by a computer system, such as computer system architecture 100 of FIG. 1. In other or similar implementations, one or more operations of method 800 can be performed by one or more other machines not depicted in the figures. In some aspects, one or more operations of method 800 can be performed by predictive engine 328 of server machine 320 described with respect to FIG. 3.

At block 810, process logic receives spectral data associated with a substrate being processed at process chamber of a manufacturing system. In some embodiments, the spectral data can be received from endpoint detection equipment, such as endpoint detection equipment 124, or other sensors disposed within or coupled to the process chamber, in accordance with previously described embodiments. At block 812, process logic generates normalized spectral data based on the received spectral data. At block 814, process logic obtains one or more subsets of normalized spectral data that includes an indication of a spectral feature corresponding to a particular type of metrology measurement. In some embodiments, process logic can obtain the one or more subsets of normalized spectral data by performing one or more operations described with respect to method 600 of FIG. 6 (e.g., operations 618-622). At block 816, process logic provides the extracted one or more subsets of normalized spectral data as input to the trained machine learning model. In some embodiments, the trained machine learning model can correspond to machine learning model 334, described with respect to FIG. 3. In some embodiments, training engine 326 selects machine learning model 334 for use by predictive engine 328, in accordance with embodiments described with respect to FIG. 9 below. At block 818, process logic obtains one or more outputs of the machine learning model. At block 820, process logic extracts, from the one or more outputs, metrology measurement data identifying: (i) one or more metrology measurement values associated with the particular type of metrology measurement, and (2) an indication of a level of confidence that each of the one or more metrology measurement values corresponds to a profile of the substrate. In one example, the level of confidence is a real number between 0 and 1 inclusive. It should be noted that, in some embodiments, the level of confidence does not correspond to a probability. For example, the sum of the confidence levels for all metrology measurement values may not equal 1.

In some embodiments, process logic can use the metrology measurement data to provide a metrology measurement value for the substrate being processed at the manufacturing system. In some embodiments, if the level of confidence for the metrology measurement value satisfies a threshold condition, then a substrate as identified as being associated with the metrology measurement value. Process logic can determine that the level of confidence for the metrology measurement value satisfies the threshold condition in response to determining that the level of confidence exceeds a threshold level of confidence. Process logic can provide the metrology measurement value to process endpoint engine 330, in accordance with embodiments described with respect to FIG. 10.

Figure 9:
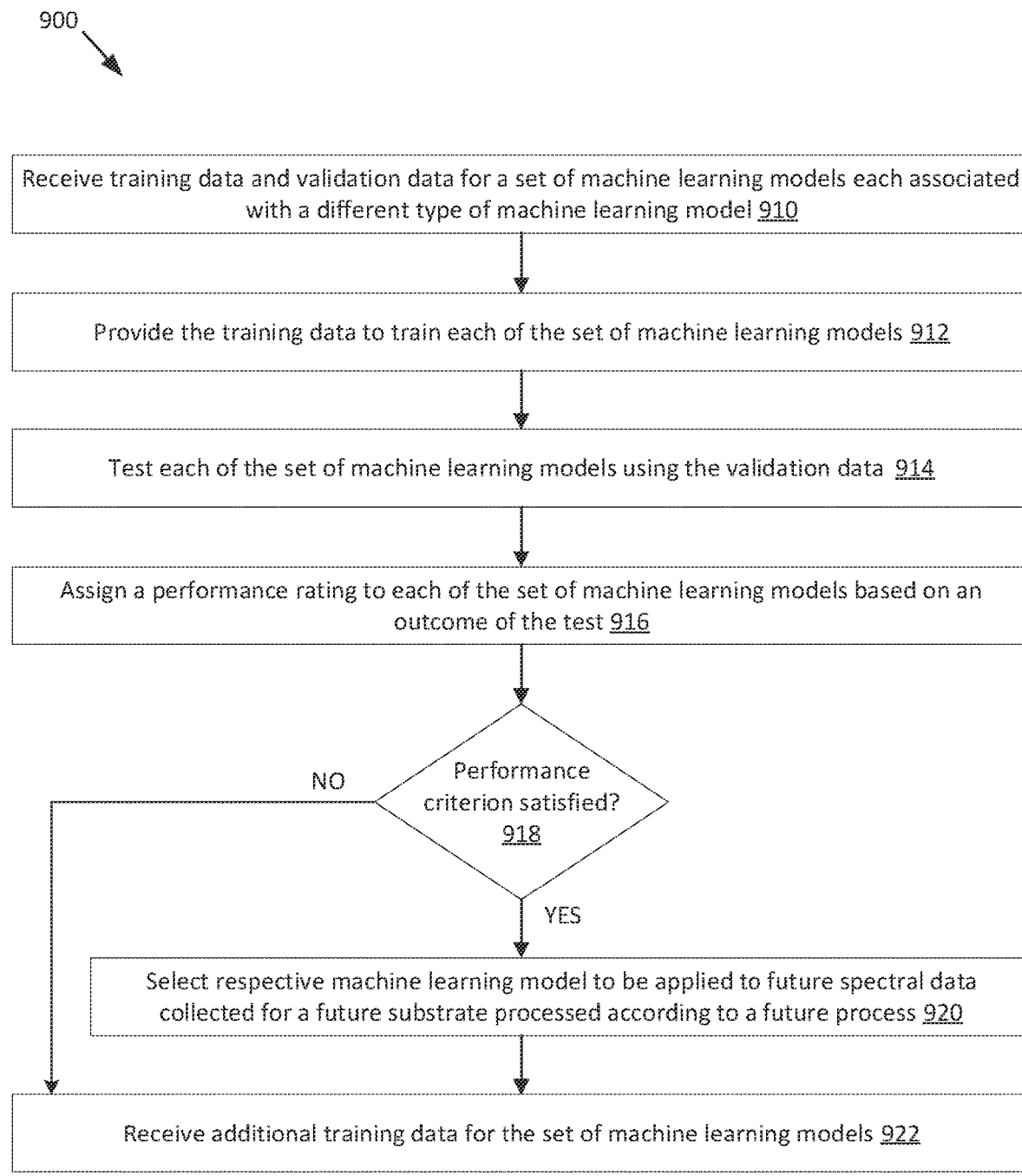
FIG. 9 is a flow chart of a method for selecting a machine learning model for estimating a type of metrology measurement value, according to aspects of the present disclosure.

FIG. 9 is a flow chart of a method 900 for selecting a machine learning model for estimating a type of metrology measurement value, according to aspects of the present disclosure. Method 900 is performed by process logic that can include hardware (circuitry, dedicated logic, etc.), software (such as is run on a general purpose computer system or a dedicated machine), firmware, or some combination thereof. In one implementation, method 900 can be performed by a computer system, such as computer system architecture 100 of FIG. 1. In other or similar implementations, one or more operations of method 900 can be performed by one or more other machines not depicted in the figures. In some aspects, one or more operations of method 900 can be performed by training engine 326 of server machines 320 or 350, described with respect to FIG. 3.

At block 910, process logic receives training data and/or validation data for a set of machine learning models. Each of the set of machine learning models can correspond to a different machine learning model type. For example, each of the set of machine learning models can correspond to a linear regression model, a partial least squares regression model, a Gaussian regression model, a random forest model, a support vector machine model, a neural network, a ridge regression model, and so forth. In some embodiments, process logic can receive training data and the validation data from training set generator 324 of server machines 320 or 350. Training set generator 324 can generate training data in accordance with embodiments described with respect to method 400 of FIG. 4. In other or similar embodiments, process logic can receive the training data from training set generator 324 and can generate the validation data based on the received training data. Training data can correspond to training set 340 and validation data can correspond to data included in validation set 342, described with respect to FIG. 3.

At block 912, process logic trains each of the set of machine learning models using the received training data. At block 914, process logic performs one or more testing operations for each of the set of machine learning models using the validation data. As described above, validation set 342 can include spectral data and metrology data for a prior substrate processed at a process chamber that is different from spectral data and metrology data included the training data. To perform the one or more testing operations, process logic can provide the spectral data of validation set 342 as input to each of the set of trained machine learning models and can obtain one or more outputs of each of the trained models. Process logic can extract a metrology measurement value from the obtained one or more outputs, in accordance with embodiments provided herein.

At block 916, process logic assigns a performance rating to each of the set of machine learning models based on an outcome of the one or more testing operations performed with respect to block 914. In some embodiments, process logic can assign a performance rating to a respective machine learning model based on an accuracy score determined for the machine learning model. Process logic can determine an accuracy score based on a difference between a metrology measurement value extracted from output(s) of the respective machine learning model and an actual metrology measurement value for a substrate falls below a threshold difference value. For example, as described with respect to block 914, process logic can provide spectral data from validation set 342 as input to a respective machine learning model and can extract a metrology value from an output of the model. Process logic can compare the extracted metrology value with an actual metrology measurement value associated with the provided spectral data of the validation set 342. Process logic can assign an accuracy score to the model based on the difference between the extracted value and the actual value of validation set 342. For example, process logic can assign a high accuracy score to a respective model if the difference between the extracted value produced by the model and the actual value is small. Similarly, process logic can assign a low accuracy score to the respective model if the difference is large.

In additional or alternative embodiments, process logic can further assign the performance rating to the respective machine learning model based on a speed score determined for the machine learning model. In some embodiments, process logic can determine the speed score based on an amount of time after the process logic provides the spectral data as input to the model that the one or more outputs of the model are obtained. In other or similar embodiments, process logic can determine the speed score based on the amount of time after the process logic provides the spectral data as input to the model that the process logic extracts the metrology measurement value from the one or more obtained outputs. In one example, the process logic can assign a high speed score to a respective model if the amount of time after the process logic provides the spectral data as input to the model that the model provides the one or more outputs (or the process logic extracts the metrology measurement value) is small.

In some embodiments, process logic can assign the performance rating to the respective machine learning model based on an efficiency score determined for the machine learning model. As described with respect to FIG. 3, in some embodiments, training engine 356 can be included at server machine 350, which is separate from server machine 320. In such embodiments, training engine 356 can train each of the set of the machine learning models at server machine 350. Training engine 356 can perform the one or more testing operations described with respect to block 914 to determine which of the set of machine learning models are to be transmitted to server machine 320 for use by predictive engine 328. Process logic can determine the efficiency score for a respective machine learning model based on an overall system efficiency (e.g., for the manufacturing system) with respect to transmitting the respective machine learning model from server machine 350 to server machine 320 and/or initializing the respective machine learning model at server machine 320. In some embodiments, process logic can determine the efficiency score based on an amount of memory used to store the respective trained machine learning model, the amount of memory available at data store 332 of server machine 320, the amount of network bandwidth available to transmit the respective trained machine learning model to server machine 320, and so forth.

At block 918, process logic determines whether a performance criterion is satisfied based on the assigned performance rating for each of machine learning models. In some embodiments, process logic can determine whether the performance criterion is satisfied by determining whether the assigned performance rating (i.e., determined based on the accuracy score and, in some embodiments, the speed score and/or the efficiency score) for a respective machine learning model exceeds a threshold performance score. In other or similar embodiments, process logic can determine whether the performance criterion is satisfied by determining whether the accuracy score for the respective model exceeds a threshold score and whether the overall performance rating (i.e., determined based on the accuracy score and the speed score and/or the efficiency score) for the respective model exceeds a threshold performance score. In some embodiments, more than one trained machine learning model can be associated with an accuracy score and/or a performance rating that satisfies a threshold score and/or threshold rating, respectively. In such embodiments, process logic can determine that the respective model of the more than one trained models that is associated with the highest accuracy score and/or performance rating that satisfies the performance criterion. In some embodiments, process logic can determine that no trained machine learning models of the set of machine learning models are associated with an accuracy score and/or performance rating that satisfies the threshold score and/or threshold rating, respectively. In such embodiments, process logic can determine that no model satisfies the performance criterion.

In response to determining that the performance criterion is satisfied, process logic proceeds to block 920. At block 920, process logic selects a respective machine learning model to be applied to future spectral data collected for future substrates processed according to a future substrate process. As described above, in some embodiments, training engine 326 can be included with predictive engine 328 at server machine 320. In such embodiments, in response to selecting the respective machine learning model to be applied to future spectral data, process logic can store the respective model and/or an indication that the respective model is to be used by predictive engine 328 at data store 332. In other embodiments, training engine 326 can be included at server machine 350. In such embodiments, in response to training engine 326 selecting the respective machine learning model to be applied to future spectral data, server machine 350 can transmit the respective machine learning model to server machine 320 for storage at data store 150.

In response to determining that the performance criterion is not satisfied, process logic proceeds to block 922. At block 922, process logic receives additional training data for further training of the set of machine learning models. Process logic can receive the additional training data from training set generator 324, in accordance with previously described embodiments.

Figure 10:
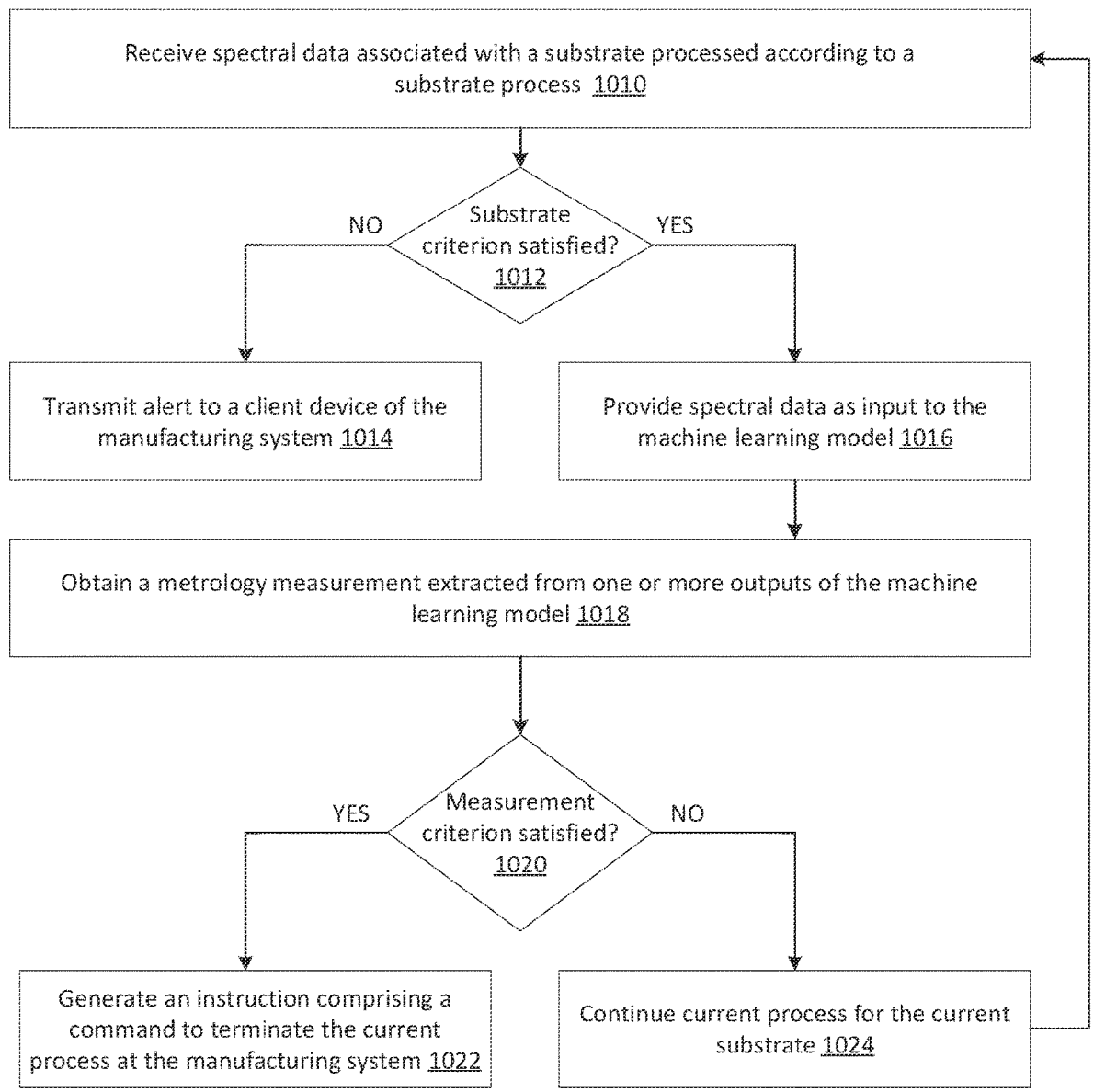
FIG. 10 is a flow chart of a method for detecting an endpoint of a substrate process using a machine learning model, according to aspects of the present disclosure.

FIG. 10 is a flow chart of a method 1000 for detecting an endpoint of a substrate process using a machine learning model, according to aspects of the present disclosure. Method 1000 is performed by process logic that can include hardware (circuitry, dedicated logic, etc.), software (such as is run on a general purpose computer system or a dedicated machine), firmware, or some combination thereof. In one implementation, method 1000 can be performed by a computer system, such as computer system architecture 100 of FIG. 1. In other or similar implementations, one or more operations of method 1000 can be performed by one or more other machines not depicted in the figures. In some aspects, one or more operations of method 1000 can be performed by process endpoint engine 330 of server machine 320, described with respect to FIG. 3.

At block 1010, process logic receives spectral data associated with a current substrate processed according to a current process at manufacturing system 200. In some embodiments, process logic can receive the current spectral data from endpoint detection equipment 124 or other sensors disposed within or coupled to a process chamber performing the current process, as previously described. In some embodiments, process logic can receive the current spectral data at particular time periods of the current process. For example, endpoint detection equipment 124 can be configured to collect spectral data for the current substrate at particular intervals (e.g., once every second) during the substrate process. Endpoint detection equipment 124 can collect the spectral data at a respective interval of the substrate process and transmit the spectral data to server machine 320, where it is received by process logic of process endpoint engine 330.

At block 1012, process logic determines whether a substrate criterion is satisfied. In some embodiments, process logic can determine that a substrate criterion is satisfied by determining that the received spectral data corresponds to spectral data associated with a particular type of substrate process and/or the particular type of substrate. For example, process logic can retrieve (e.g., from data store 150) spectral data that was previously collected for a particular type of substrate that was processed according to a particular type of process. The previously collected spectral data can include one or more spectral data features (e.g., a spectral signature) that are specific to the type of substrate and/or the type of process, or a particular step or time period of the type of process. Process logic can determine whether the received spectral data for the current substrate includes one or more spectral data features that correspond to (i.e., approximately equal) the respective spectral data features that are included in the previously collected spectral data.

In response to determining that the current spectral data features do not correspond to the spectral features of the previously collected data, process logic can determine that the substrate criterion is not satisfied. A determination that the current spectral data features do not correspond to the spectral features of the previously collected data can indicate that the current substrate is not associated with the expected type of substrate for the substrate process or the current process or step of the current process does not correspond with the expected type or current step of the current process. Accordingly, in response to process logic determining that the substrate criterion is not satisfied, method 1000 continues to block 1014, where process logic transmits an alert to a client device of the manufacturing system 200. The alert can include a notification that the current substrate may not correspond with an expected type of the current substrate and/or the current process or step of the process may not correspond with an expected type or step of the process.

In response to determining that the current spectral data features correspond to the spectral features of the previously collected data, process logic can determine that the substrate criterion is satisfied. In response to process logic determining that the substrate criterion is satisfied, method 1000 continues to block 1016. At block 1016, process logic provides the spectral data to be used as input to a trained machine learning model. In some embodiments, process logic can provide the spectral data to predictive engine 328, which can cause predictive engine 328 to perform one or more operations of method 800 described with respect to FIG. 8.

At block 1018, process logic obtains a metrology measurement value extracted from one or more outputs of the trained machine learning model. In some embodiments, process logic can receive an indication of the metrology measurement value from predictive engine 328, obtained in accordance with method 800. At block 1020, process logic determines whether a metrology measurement criterion is satisfied. In some embodiments, process logic can determine whether the metrology measurement criterion is satisfied by determining whether the extracted metrology measurement value corresponds to a metrology measurement value associated with an endpoint of the current process. The extracted metrology measurement value can correspond to the metrology measurement value associated with the endpoint of the current process if a difference between the extracted value and the endpoint value falls below a difference threshold value.

In response to process logic determining the metrology measurement criterion is satisfied, method 1000 proceeds to block 1022. At block 1022, process logic generates an instruction to terminate the current process at the manufacturing system. In some embodiments, process logic can transmit the instruction to the system controller (e.g., system controller 228), which causes the system controller to terminate the current process. In other or similar embodiments, process logic can transmit the instruction to a local processing device for the process chamber, which causes the process chamber to terminate the current process. In additional or alternative embodiments, process logic can transmit the spectral data and the extracted metrology measurement value to training set generator 324 (i.e., at server machine 320 or at server machine 350) to be used as additional training data.

In response to process logic determining that the metrology measurement criterion is not satisfied, method 1000 proceeds to block 1024. At block 1024, process logic continues the current process for the current substrate. In some embodiments, process logic can continue the current process by transmitting an instruction to system controller 228 or the local controller for the process chamber to continue the current process. In other or similar embodiments, process logic can continue the current process by generating and transmitting no instruction(s). Process logic can transmit the spectral data and the extracted metrology measurement value to training set generator 324 to be used as additional training data, as described above.

Referring back to block 1020, in some embodiments, process logic can further determine whether the metrology measurement criterion is satisfied by determining whether the extracted metrology measurement value falls within a range of expected metrology measurement values associated with the time period for the current process. The range of expected metrology measurement values can include a set of values that are expected to be associated with the current substrate at the current time period of the current process. For example, if the time period is expected (i.e., in view of process data for the current substrate process and prior substrate processes) to be the final time period for the current substrate process, the range of expected metrology measurement values can include the endpoint metrology value and adjacent expected values (e.g., endpoint value±X). In response to determining that the extracted metrology measurement value does not fall within the expected range of metrology measurement values, process logic can transmit an alert to the client device of the manufacturing system as described above. In some embodiments, process logic can determine, in view of the extracted metrology measurement value, that an accuracy of the trained machine learning model no longer satisfies an accuracy criterion (i.e., an overall accuracy of the trained machine learning model falls below a threshold overall accuracy). Accordingly, process logic can transmit a notification to the client device indicating that the machine learning model is to be retrained. In some embodiments, process logic can transmit a notification to training set generator 324 and/or training engine 326 to re-train the machine learning model, in accordance with embodiments described herein.

Figure 11:
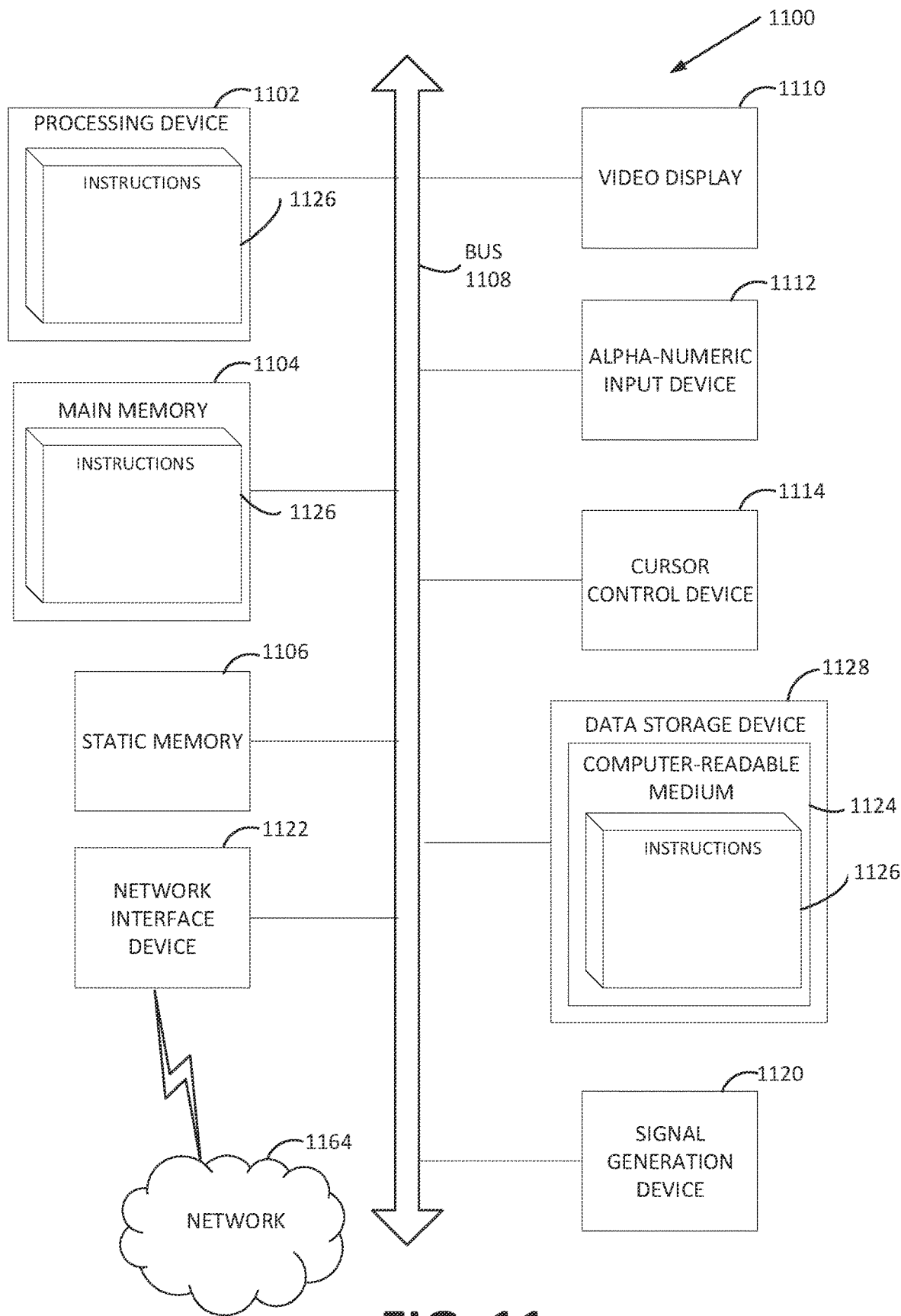
FIG. 11 depicts a block diagram of an illustrative computer system operating in accordance with one or more aspects of the present disclosure.

FIG. 11 depicts a diagrammatic representation of a machine in the example form of a computing device 1100 within which a set of instructions, for causing the machine to perform any one or more of the methodologies discussed herein, can be executed. In alternative embodiments, the machine can be connected (e.g., networked) to other machines in a Local Area Network (LAN), an intranet, an extranet, or the Internet. The machine can operate in the capacity of a server or a client machine in a client-server network environment, or as a peer machine in a peer-to-peer (or distributed) network environment. The machine can be a personal computer (PC), a tablet computer, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In embodiments, computing device 1100 can correspond to one or more of server machine 170, server machine 180, predictive server 112, system controller 228, server machine 320, or server machine 350, as described herein.

The example computing device 1100 includes a processing device 1102, a main memory 1104 (e.g., read-only memory (ROM), flash memory, dynamic random access memory (DRAM) such as synchronous DRAM (SDRAM), etc.), a static memory 1106 (e.g., flash memory, static random access memory (SRAM), etc.), and a secondary memory (e.g., a data storage device 1128), which communicate with each other via a bus 1108.

Processing device 1102 can represent one or more general-purpose processors such as a microprocessor, central processing unit, or the like. More particularly, the processing device 1102 can be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 1102 can also be one or more special-purpose processing devices such as an application specific integrated circuit (ASIC), a field programmable gate array (FPGA), a digital signal processor (DSP), network processor, or the like. Processing device 1102 can also be or include a system on a chip (SoC), programmable logic controller (PLC), or other type of processing device. Processing device 1102 is configured to execute the processing logic for performing operations and steps discussed herein.

The computing device 1100 can further include a network interface device 1122 for communicating with a network 1164. The computing device 1100 also can include a video display unit 1110 (e.g., a liquid crystal display (LCD) or a cathode ray tube (CRT)), an alphanumeric input device 1112 (e.g., a keyboard), a cursor control device 1114 (e.g., a mouse), and a signal generation device 1120 (e.g., a speaker).

The data storage device 1128 can include a machine-readable storage medium (or more specifically a non-transitory computer-readable storage medium) 1124 on which is stored one or more sets of instructions 1126 embodying any one or more of the methodologies or functions described herein. Wherein a non-transitory storage medium refers to a storage medium other than a carrier wave. The instructions 1126 can also reside, completely or at least partially, within the main memory 1104 and/or within the processing device 1102 during execution thereof by the computer device 1100, the main memory 1104 and the processing device 1102 also constituting computer-readable storage media.

While the computer-readable storage medium 1124 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing or encoding a set of instructions for execution by the machine and that cause the machine to perform any one or more of the methodologies of the present disclosure. The term "computer-readable storage medium" shall accordingly be taken to include, but not be limited to, solid-state memories, and optical and magnetic media.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure can be practiced without these specific details. In other instances, well-known components or methods are not described in detail or are presented in simple block diagram format in order to avoid unnecessarily obscuring the present disclosure. Thus, the specific details set forth are merely exemplary. Particular implementations can vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method can be altered so that certain operations can be performed in an inverse order so that certain operations can be performed, at least in part, concurrently with other operations. In another embodiment, instructions or sub-operations of distinct operations can be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
providing training data to train each of a plurality of machine learning models to provide a metrology measurement value associated with a particular type of metrology measurement for a substrate based on spectral data collected during a substrate process performed for the substrate, wherein each of the plurality of machine learning models are associated with a different type of a set of machine learning model types;
assigning a performance rating to each of the plurality of machine learning models based on an accuracy of a value for the metrology measurement provided by a respective machine learning model in view of a measured value for the metrology measurement, the measured value generated based on historical metrology data collected by metrology equipment for a prior substrate of a set of prior substrates; and
selecting, in view of the performance rating for each of the plurality of machine learning models, the respective machine learning model to be applied to future spectral data collected during a future substrate process performed for a future substrate.

2. The method of claim 1, further comprising:
receiving historical spectral data collected during a prior substrate process performed for an additional prior substrate of the set of prior substrates;
obtaining a historical metrology measurement value for the additional prior substrate, the historical metrology measurement value generated based on additional historical metrology data collected by the metrology equipment for the additional prior substrate; and
generating the training data to train each of the plurality of machine learning models, wherein generating the training data comprises:
generating a training input comprising the historical spectral data; and
generating a target output for the training input, wherein the target output comprises the historical metrology measurement value for the additional prior substrate,
and wherein providing the training data to train each of the plurality of machine learning models comprises providing: (i) a set of training inputs comprising the training input; and (ii) a set of target outputs comprising the target outputs.

3. The method of claim 2, wherein the historical spectral data is received from at least one of a system controller of a manufacturing system that performed the prior substrate process or an endpoint detection system of the manufacturing system.

4. The method of claim 2, wherein the future substrate process is to be performed for the future substrate at a first manufacturing system and the prior substrate process is performed for the prior substrate at a second manufacturing system that is different from the first manufacturing system.

5. The method of claim 1, further comprising:
obtaining a validation data set for the set of prior substrates, the validation data set comprising (i) historical spectral data collected during a prior substrate process performed for an additional prior substrate of the set of prior substrates, and (ii) the measured value for the metrology measurement;
providing the historical spectral data as input to each of the plurality of machine learning models;
extracting the value for the metrology measurement from one or more outputs of the respective machine learning model; and
determining an accuracy for the respective machine learning model based on a difference between the extracted value for the metrology measurement and the measured value for the metrology measurement.

6. The method of claim 5, wherein the performance rating for each of the plurality of machine learning models is further assigned based on at least one of a speed that the respective machine learning model provides the extracted value for the metrology measurement or an amount of time to transmit the respective machine learning model to a processing device for a manufacturing system configured to perform the future substrate process for the future substrate.

7. The method of claim 1, wherein selecting the respective machine learning model to be applied to future spectral data comprises:
determining that the performance rating assigned to the respective machine learning model satisfies a performance criterion.

8. The method of claim 7, wherein determining that the performance rating assigned to the respective machine learning model satisfies the performance criterion comprises:
determining that the performance rating exceeds a threshold performance rating and that the performance rating is larger than other performance ratings for other machine learning models of machine learning models.

9. The method of claim 1, further comprising:
responsive to determining that no performance rating assigned to any machine learning model of the plurality of machine learning models exceeds a performance rating threshold, obtaining additional training data for each of the plurality of machine learning models; and
providing the additional training data to further train each of the plurality of machine learning models.

10. The method of claim 1, wherein the set of machine learning model types comprises a linear regression model type, a partial least squares regression model type, a Gaussian regression model type, a random forest model type, a support vector machine model type, a neural network type, or a ridge regression model type.

11. A system comprising:
a memory; and
a processing device coupled to memory, the processing device to:
obtain a machine learning model trained to provide a current value for a metrology measurement based on current spectral data collected during a current process for a current substrate at a manufacturing system, wherein the trained machine learning model is associated with a performance rating that satisfies a performance criterion associated with a type of the metrology measurement;
provide the current spectral data as input to the trained machine learning model;
extract, from one or more outputs of the trained machine learning model, an indication of a respective metrology measurement value corresponding to the current substrate, wherein the respective metrology measurement value is associated with the type of the metrology measurement; and
responsive to determining that the respective metrology measurement value satisfies a metrology measurement criterion associated with the current process, generating an instruction comprising a command to terminate the current process at the manufacturing system.

12. The system of claim 11, wherein the processing device is part of a system controller for a manufacturing system performing the current process for the substrate, and wherein to obtain the trained machine learning model, the processing device is to:
receive the trained machine learning model from a processing device of a computing system coupled to the system controller.

13. The system of claim 11, wherein to obtain the trained machine learning model, the processing device is to:
provide training data to train the machine learning model to provide the current value for the metrology measurement.

14. The system of claim 11, wherein the processing device is further to:
obtain the current spectral data collected during the current process for the current substrate; and
responsive to determining the current spectral data does not correspond to target spectral data associated with the current substrate, transmit an error notification to a client device coupled to the manufacturing system.

15. The system of claim 11, wherein to determine that the respective metrology measurement value satisfies the metrology measurement criterion, the processing device is to:
determine that the respective metrology measurement value corresponds to a target metrology measurement value associated with the current process for the current substrate.

16. The system of claim 11, wherein the processing device is further to:
responsive to determining that the respective metrology measurement value does not satisfy the metrology measurement criterion, performing at least one of:
transmitting an error notification to a client device coupled to the manufacturing system; or
providing the collected spectral data and the respective metrology measurement value as training data to further train the trained machine learning model.

17. The system of claim 11, wherein the trained machine learning model is associated with at least one of a linear regression model type, a partial least squares regression model type, a Gaussian regression model type, a random forest model type, a support vector machine model type, a neural network type, or a ridge regression model type.

18. The system of claim 11, wherein the trained machine learning model is trained using historical spectral data collected during a prior substrate process performed for a prior substrate at an additional manufacturing system that is different from the manufacturing system performing the current process for the current substrate.

19. A non-transitory computer readable medium comprising instructions that, when executed by a processing device, cause the processing device to:
provide training data to train each of a plurality of machine learning models to provide a metrology measurement value associated with a particular type of metrology measurement for a substrate based on spectral data collected during a substrate process performed for the substrate, wherein each of the plurality of machine learning models are associated with a different type of a set of machine learning model types;
assign a performance rating to each of the plurality of machine learning models based on an accuracy of a value for the metrology measurement provided by a respective machine learning model in view of a measured value for the metrology measurement, the measured value generated based on historical metrology data collected by metrology equipment for a prior substrate of a set of prior substrates; and
select, in view of the performance rating for each of the plurality of machine learning models, the respective machine learning model to be applied to future spectral data collected during a future substrate process performed for a future substrate.

20. The non-transitory computer readable medium of claim 19, wherein to determine that the respective metrology measurement value satisfies a metrology measurement criterion, the processing device is to:

determine that the respective metrology measurement value corresponds to a target metrology measurement value associated with a current process for a current substrate.

\* \* \* \* \*